(12) United States Patent
Seo et al.

(10) Patent No.: US 8,030,196 B2
(45) Date of Patent: Oct. 4, 2011

(54) TRANSISTOR FORMATION USING CAPPING LAYER

(75) Inventors: Bong-Seok Seo, Hwaseong-si (KR); Jong-Ho Yang, SengNam (KR); Dong Hee Yu, Whasung (KR); O Sung Kwon, Wappingers Falls, NY (US); Oh-Jung Kwon, Hopewell Junction, NY (US)

(73) Assignees: Samsung Electronics Co., Ltd., Suwon-Si (KR); International Business Machines Corporation, Armonk, NY (US); Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/685,933

(22) Filed: Jan. 12, 2010

(65) Prior Publication Data
US 2011/0171794 A1    Jul. 14, 2011

(51) Int. Cl.
*H01L 21/3205* (2006.01)
*H01L 21/4763* (2006.01)

(52) U.S. Cl. . 438/587; 438/585; 438/591; 257/E21.444; 257/E21.431

(58) Field of Classification Search .......... 438/587, 438/585, 692, 591, 285; 257/E21.23, E21.444, 257/E21.621, E21.431
See application file for complete search history.

(56) References Cited

U.S. PATENT DOCUMENTS

| | | | |
|---|---|---|---|
| 6,593,198 B2 | 7/2003 | Segawa | |
| 2006/0099748 A1* | 5/2006 | Satou | 438/162 |
| 2008/0173946 A1* | 7/2008 | Zhu et al. | 257/369 |
| 2009/0302348 A1* | 12/2009 | Adam et al. | 257/190 |

FOREIGN PATENT DOCUMENTS
KR    10-0613279    8/2006
* cited by examiner

*Primary Examiner* — Walter L Lindsay, Jr.
(74) *Attorney, Agent, or Firm* — F. Chau & Associates, LLC

(57) ABSTRACT

A method of transistor formation using a capping layer in complimentary metal-oxide semiconductor (CMOS) structures is provided, the method including: depositing a conductive layer over an n-type field effect transistor (nFET) and over a p-type field effect transistor (pFET); depositing a capping layer directly over the conductive layer; etching the capping and conductive layers to form a capped gate conductor to gates of the nFET and pFET, respectively; ion-implanting the nFET transistor with a first dopant; and ion-implanting the pFET transistor with a second dopant, wherein ion-implanting a transistor substantially dopes its source and drain regions, but not its gate region.

19 Claims, 33 Drawing Sheets

| 07341FPS002.004 WF ID# | | Hot Phos after eSiGe Etch | Sp2 | S/D I/I | Remark |
|---|---|---|---|---|---|
| 2 | 33PAU131SJE4 | Full | XSEM | | |
| 8 | 33PAU142SJF7 | Full | | XSEM | |
| 18 | 33PAU122SJE2 | 100A | XSEM | | Nitride is remaining only at nFET |
| 21 | 33PAU125SJC2 | 100A | | XSEM | |
| 23 | 33PAU128SJA2 | 100A | | | |

TRANSISTOR FORMATION USING CAPPING LAYER

BACKGROUND OF THE INVENTION

The present disclosure generally relates to semiconductor integrated circuits. More particularly, the present disclosure relates to the formation of transistors in complimentary metal-oxide semiconductor (CMOS) structures.

SUMMARY OF THE INVENTION

A method is disclosed for transistor formation using a capping layer in complimentary metal-oxide semiconductor (CMOS) structures. Exemplary embodiments are provided.

An exemplary embodiment method of transistor formation using a capping layer in complimentary metal-oxide semiconductor (CMOS) structures includes: depositing a conductive layer over an n-type field effect transistor (nFET) and over a p-type field effect transistor (pFET); depositing a capping layer directly over the conductive layer; etching the capping and conductive layers to form at least one capped gate conductor to gates of the nFET and pFET, respectively; ion-implanting the nFET transistor with a first dopant; and ion-implanting the pFET transistor with a second dopant, wherein ion-implanting at least one of the transistors substantially dopes its source and drain regions, but not its gate region.

The present disclosure will be further understood from the following description of exemplary embodiments, which is to be read in connection with the accompanying drawings.

BRIEF DESCRIPTION OF THE DRAWINGS

The present disclosure provides methods for transistor formation using a capping layer in complimentary metal-oxide semiconductor (CMOS) structures in accordance with the following exemplary figures, in which.

DETAILED DESCRIPTION OF PREFERRED EMBODIMENTS

In complementary metal-oxide semiconductor (CMOS) transistor fabrication, it is desirable to tightly control the critical width dimension of the gate conductors, whether they are to be formed from polycrystalline silicon (poly) or metal. Exercising tight control of the gate conductor width reduces short circuit faults, for example, such as the all too common contact to poly conductor gate fault for nFETs. The present disclosure addresses various exemplary 45-nm and 32-nm devices using polysilicon conductor gate and/or metal gates, but is not limited to such technologies.

In 45-nm gate examples, a gate width of 45 nm is desirable. The gate may be made of nickel-silicide (NiSi), for instance.

In addition, contacts may pass near the gates to reach register (RX) diffusion areas. Here, one issue is that a distance between a gate and contact of less than about 70 nm may lead to a short circuit. This is more often the case for nFETs than for pFETs.

During the NiSi formation process for gates, unwanted filaments may appear at peak concentration levels, and can be controlled to some extent by adjusting the Ni concentration. Unfortunately, nFET roughness is worse than pFET roughness due to the relatively heavier dopants preferably used for nFETs. That is, while the nFET and pFET widths may be about the same after etching, the nFET may become relatively wider after silicon (Si) source/drain (S/D) formation or doping. Here, arsenic (As) and/or phosphene dopants are desirable for nFETs. Arsenic is preferably used for shallow junctions, while phosphene is preferably used for deep junctions. The relatively lighter boron (B) and/or boron di-fluoride (BF2) are preferably used for pFETs. Thus, the tops of the nFET gates may become rounded by the heavier arsenic, for example.

The present disclosure addresses both rounding and undesirable widening of the gates by using a capping layer to protect gate conductors during S/D ion-implantation or doping. The capping layer may comprise nitride and/or oxide. The gate conductors may be polysilicon conductor gate and/or metal gate.

Figure 1:
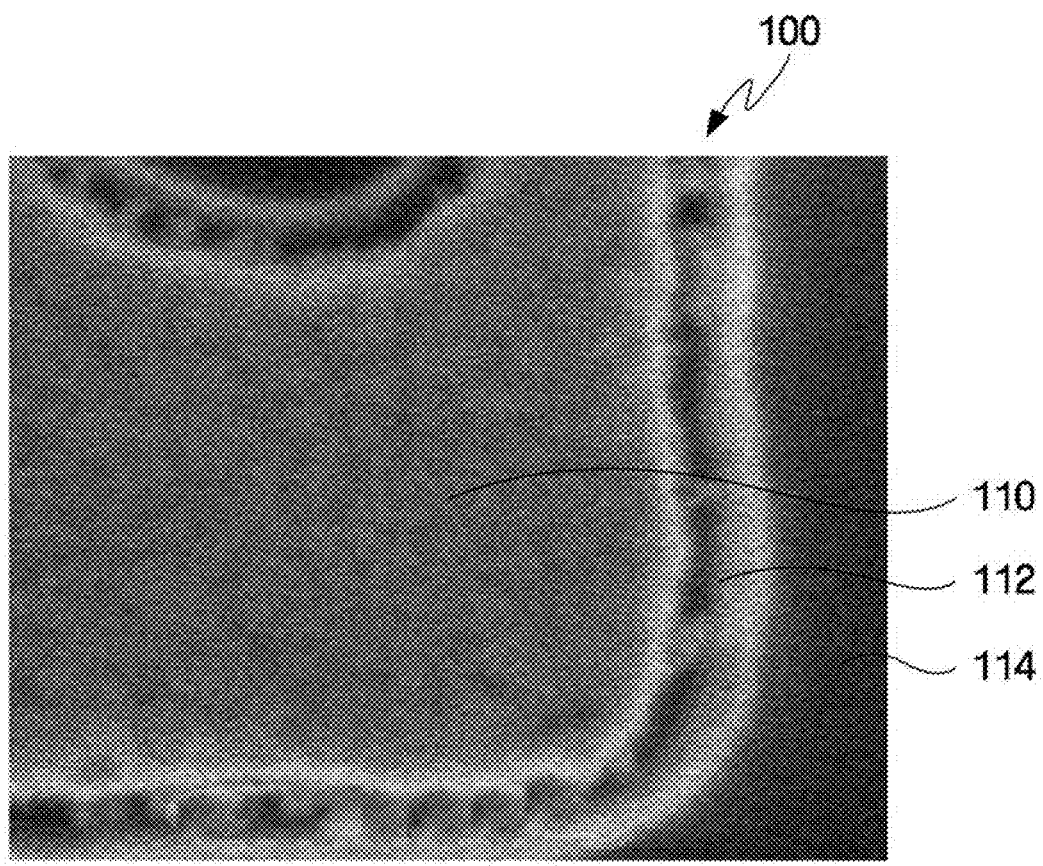
FIG. 1 shows a schematic diagram in narrow-angle horizontal top view of a semiconductor structure in accordance with an exemplary embodiment of the present disclosure.

As shown in FIG. 1, a semiconductor structure is indicated generally by the reference numeral 100. The structure 100 is shown here in a relatively narrow angle horizontal top view. The structure 100 includes a polycrystalline silicon (polysilicon or poly) conductor 110 comprising at least one transistor gate, a rough or bumpy metal-silicide outer edge 112 around the gate, and a spacer 114 adjacent to the outer edge. In semiconductors using silicide processing, such as typical 45 nm and 32 nm technologies, the roughness of gate metal-silicide (e.g., NiSi) bumps against a spacer typically leads to short-circuit defects. For example, short circuits are likely to occur wherever the space between a gate to a drop contact is less than a threshold, such as about 70 nm in a current example. The drop contact might be a vertical substrate tap or diffusion area connection contact, or even a via connection (VC) between two metal layers.

Figure 2:
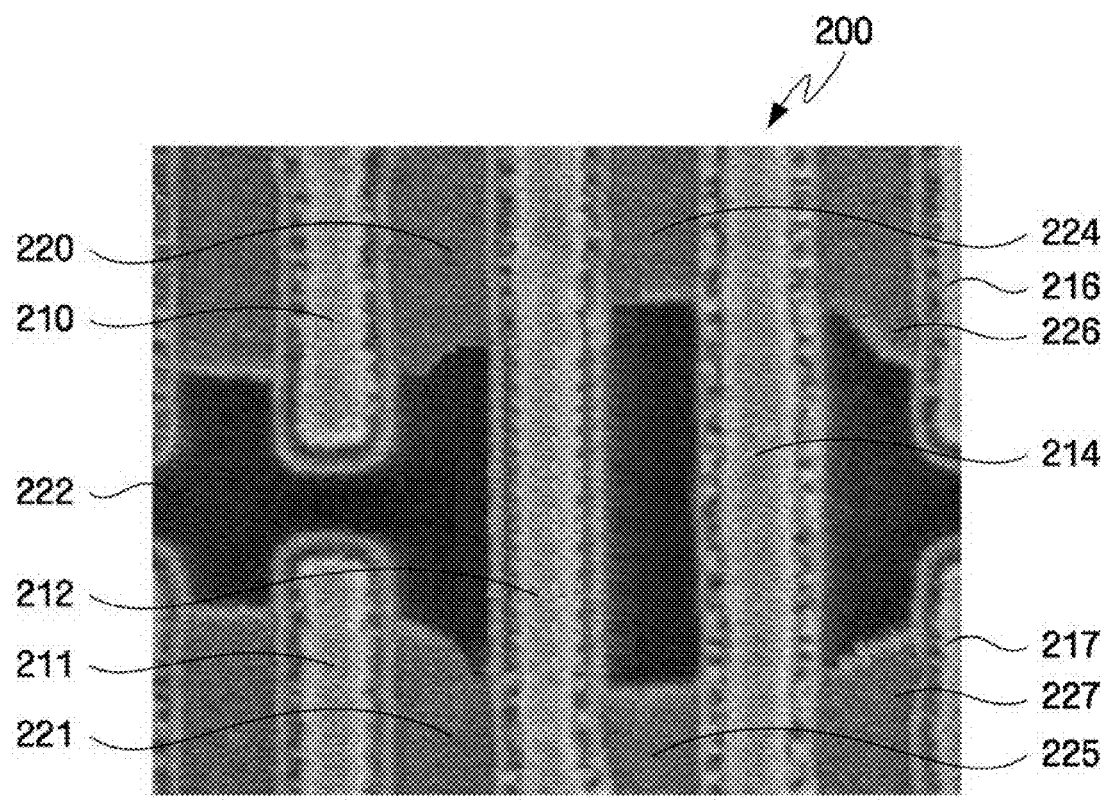
FIG. 2 shows a schematic diagram in wide-angle horizontal top view of a semiconductor structure in accordance with an exemplary embodiment of the present disclosure.

Turning to FIG. 2, another semiconductor structure is indicated generally by the reference numeral 200. The structure 200 is shown here in a relatively wider top view than that of the structure 100 of FIG. 1. The structure 200 includes short upper gate lines 210 and 216; short lower gate lines 211 and 217; long gate lines 212 and 214; diffusion areas 220, 221, 226 and 227 disposed between long and short gate lines; diffusion areas 224 and 225 disposed between the long gate lines 212 and 214; and substrate or insulation 222 (e.g., p-type substrate, n-well regions, or silicon-dioxide insulation material) disposed elsewhere. Here, the minimum distance between short and long gate lines is about 70 nm, while the minimum distance between the long gate lines is about 63 nm. The distance between short gate lines on opposite sides of the long gate lines is about 390 nm.

Figure 3:
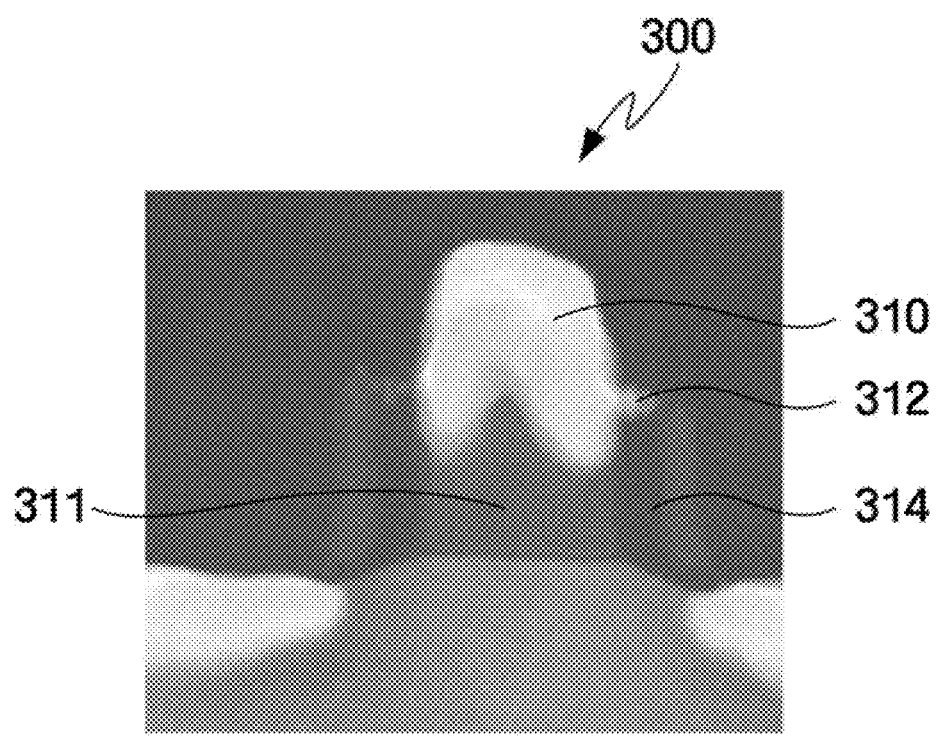
FIG. 3 shows a schematic diagram in vertical side view of a semiconductor structure having a stringer in accordance with an exemplary embodiment of the present disclosure.

Turning now to FIG. 3, another semiconductor structure is indicated generally by the reference numeral 300. The structure 300 is shown here in a vertical side view. The structure 300 includes a gate 310 disposed on a silicide upper portion of an nFET gate 311, a NiSi filament or stringer 312, and a spacer 314. Here, the NiSi filament or stringer 312 reduces the minimum width of the spacer 314.

Figure 4:
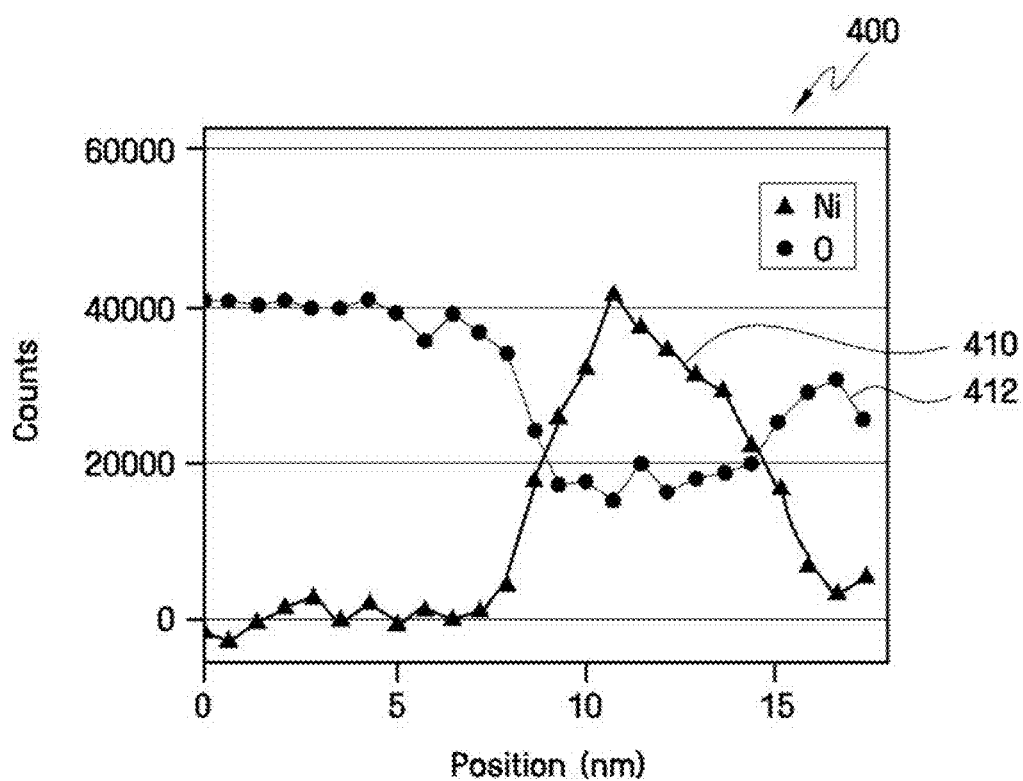
FIG. 4 shows a graphical diagram of molecular concentrations versus depth across a stringer of FIG. 3 in accordance with an exemplary embodiment of the present disclosure.

As shown in FIG. 4, a plot of molecular concentrations or counts versus depth, taken along the line 312 of FIG. 3, is indicated generally by the reference numeral 400. The plot 400 was produced by a Transmission Electron Microscope (TEM) analysis. The plot 400 shows the nickel (Ni) concentration 410 and the oxide (O) concentration 412 over an 18 nm measuring depth. As indicated by the plot 400, the concentration of Ni is substantially elevated between about the 9 and 14 nm marks, where it actually exceeds the concentration of O.

Figure 5:
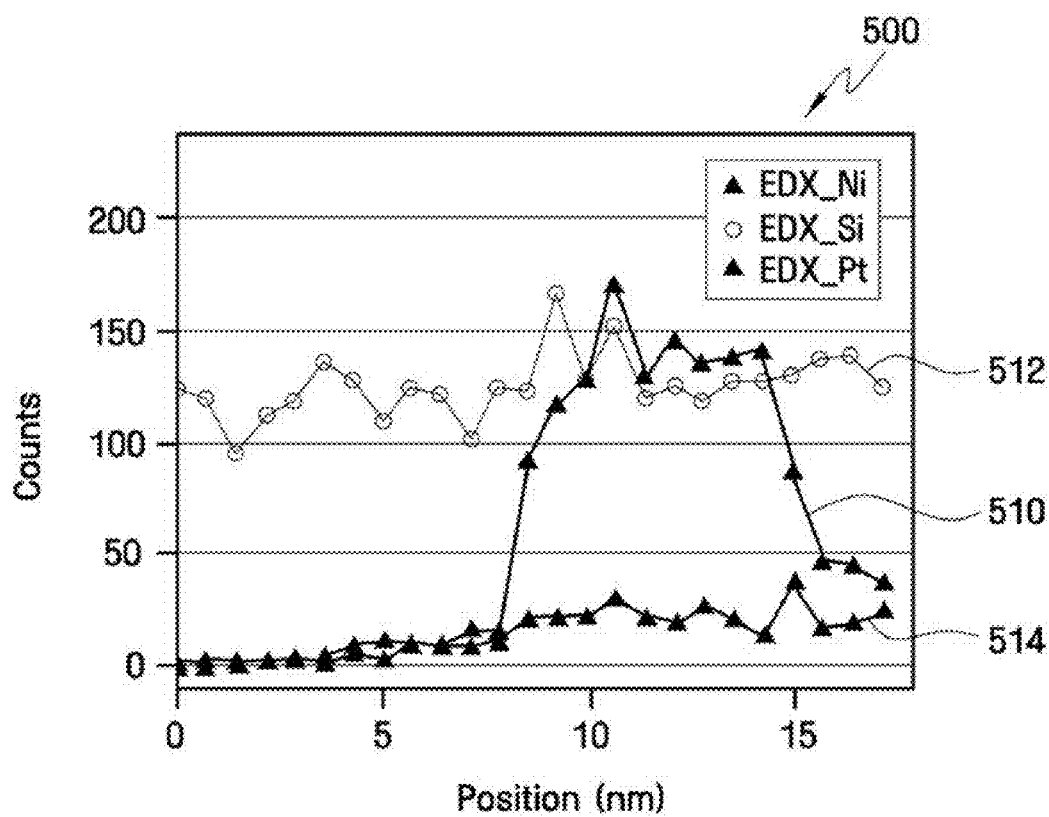
FIG. 5 shows a graphical diagram of molecular concentrations versus depth across a stringer of FIG. 3 in accordance with an exemplary embodiment of the present disclosure.

Turning to FIG. 5, another plot of molecular concentrations or counts versus depth, taken along the line 312 of FIG. 3, is indicated generally by the reference numeral 500. The plot 500 was produced using Electron Energy Loss Spectroscopy (EELS) and Energy Dispersive X-ray Spectroscopy (EDX) analyses. The plot 500 shows the relative nickel (Ni) concentration 510, the relative silicon (Si) concentration 512, and the relative platinum (Pt) concentration over an 18 nm measuring depth. As indicated by the plot 500, the concentration of Ni is substantially elevated between about the 10 and 14 nm marks, particularly where it equals or exceeds the concentration of Si.

Figure 6:
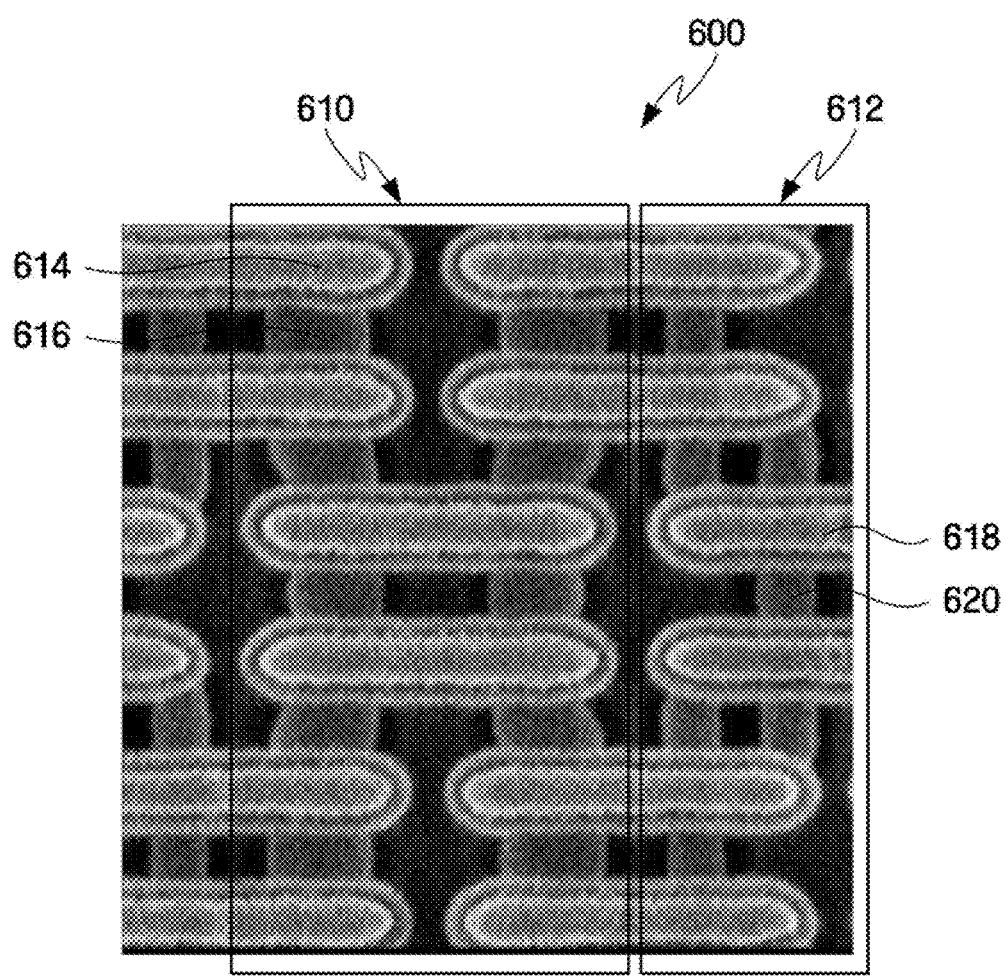
FIG. 6 shows a schematic diagram in horizontal top view of an SRAM structure after a NiSi formation process in accordance with an exemplary embodiment of the present disclosure.

Turning now to FIG. 6, a semiconductor structure is indicated generally by the reference numeral 600. The structure 600 shows a portion of an exemplary SRAM in top view after a NiSi formation process (RTS2). The structure 600 includes an nFET portion 610 and a pFET portion 612. The nFET portion 610 includes n-gate parts 614 and diffusion regions 616 in a p-substrate. The pFET portion 612 includes p-gate parts 618 and diffusion regions 620 in n-wells of the p-substrate. At this stage, the gate widths are substantially the same for both the nFET and pFET portions.

Figure 7:
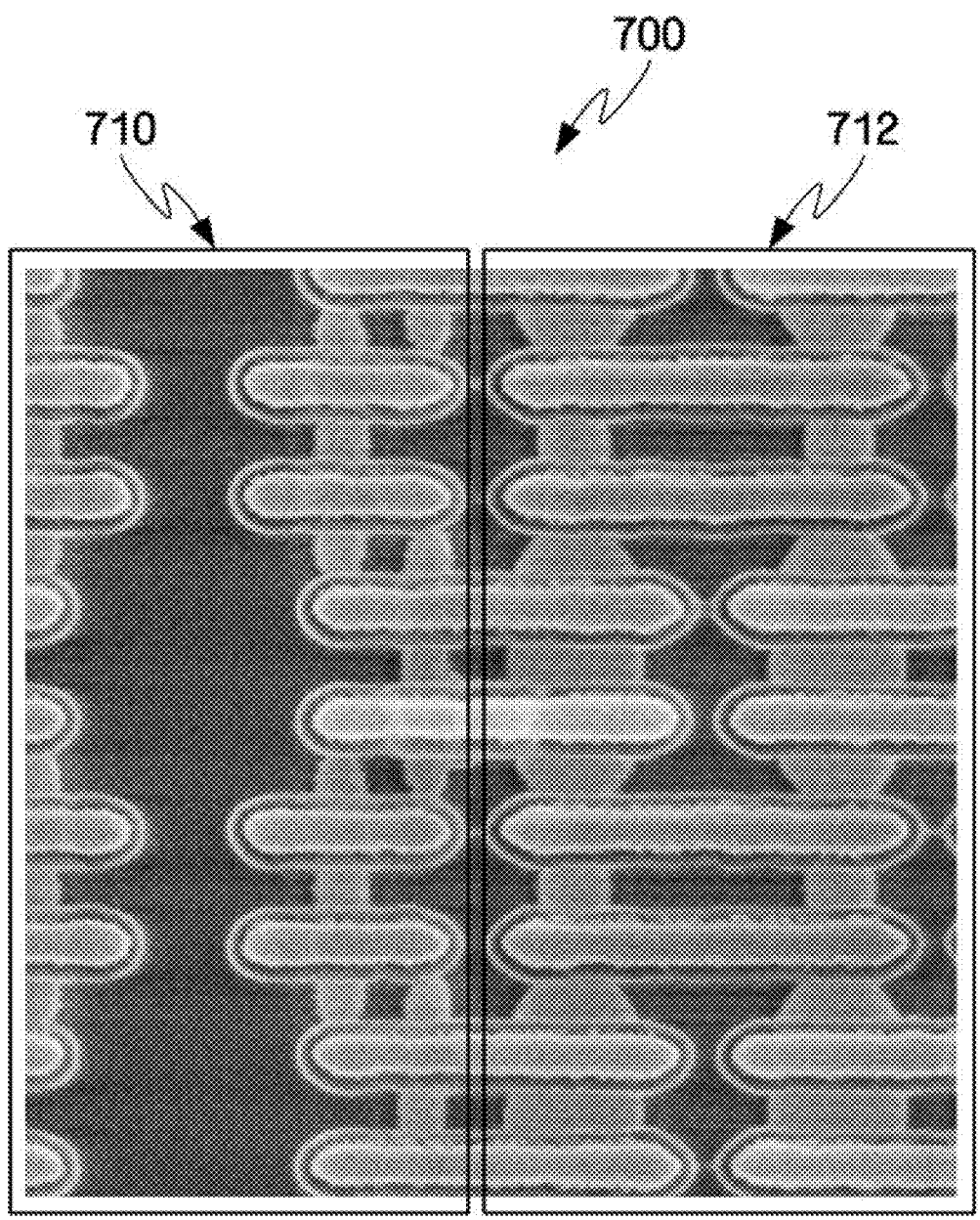
FIG. 7 shows a schematic diagram in horizontal top view of an SRAM structure after SPT processing in accordance with an exemplary embodiment of the present disclosure.

As shown in FIG. 7, a semiconductor structure is indicated generally by the reference numeral 700. The structure 700 shows a portion of the exemplary SRAM 600 of FIG. 6 in top view, but now after Stress Proximity Technique (SPT) processing. The structure 700 includes a pFET portion 710 and an nFET portion 712. At this stage, the nFET portion exhibits larger gate width (height in the figure) and silicide bumps than the pFET portion.

Figure 8:
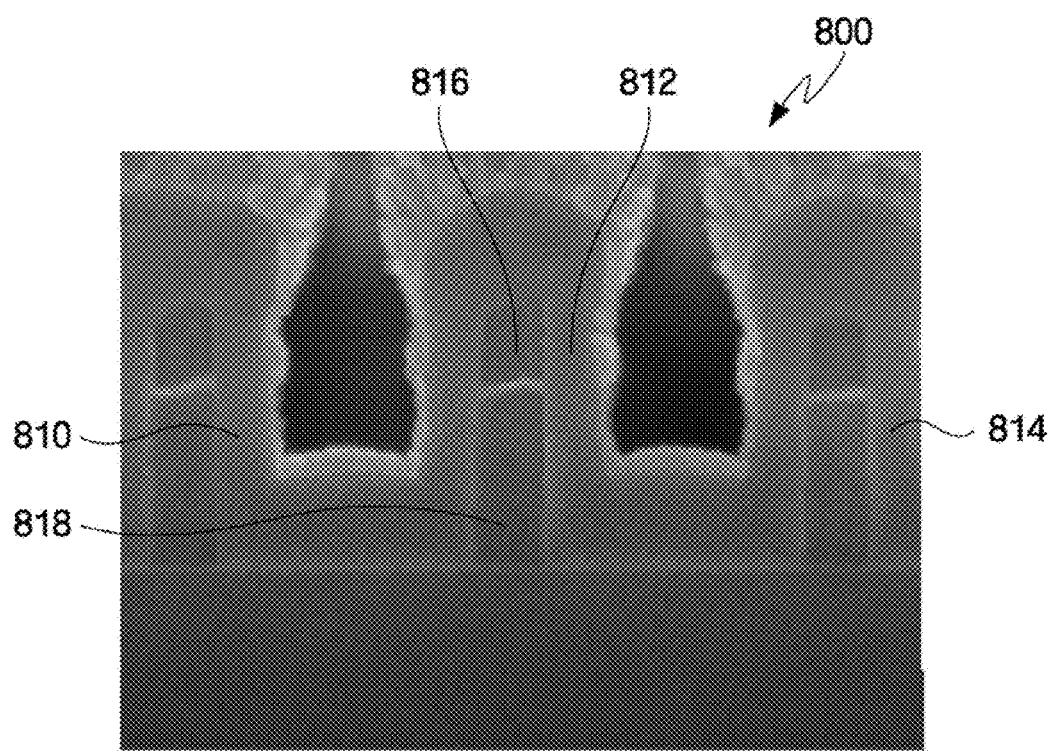
FIG. 8 shows a schematic diagram in vertical side view of a pFET structure in accordance with an exemplary embodiment of the present disclosure.

Turning to FIG. 8, a semiconductor pFET structure is indicated generally by the reference numeral 800, shown here in side view. The pFET 800 includes like spacers 810, 812 and 814, spaced about 173.0 nm apart; a polycrystalline silicon conductor gate 816 disposed to the right of the spacer 810 and directly to the left of the spacer 812, where the gate has a height of about 38.6 nm; and a gate 818 disposed directly below the gate, the gate 818 having a width of about 38.3 nm. The gate widths stay substantially the same for both nFET and pFET during the gate etch step. However, the nFET gate widths tend to increase more than the pFET gate widths during subsequent processing steps.

Figure 9:
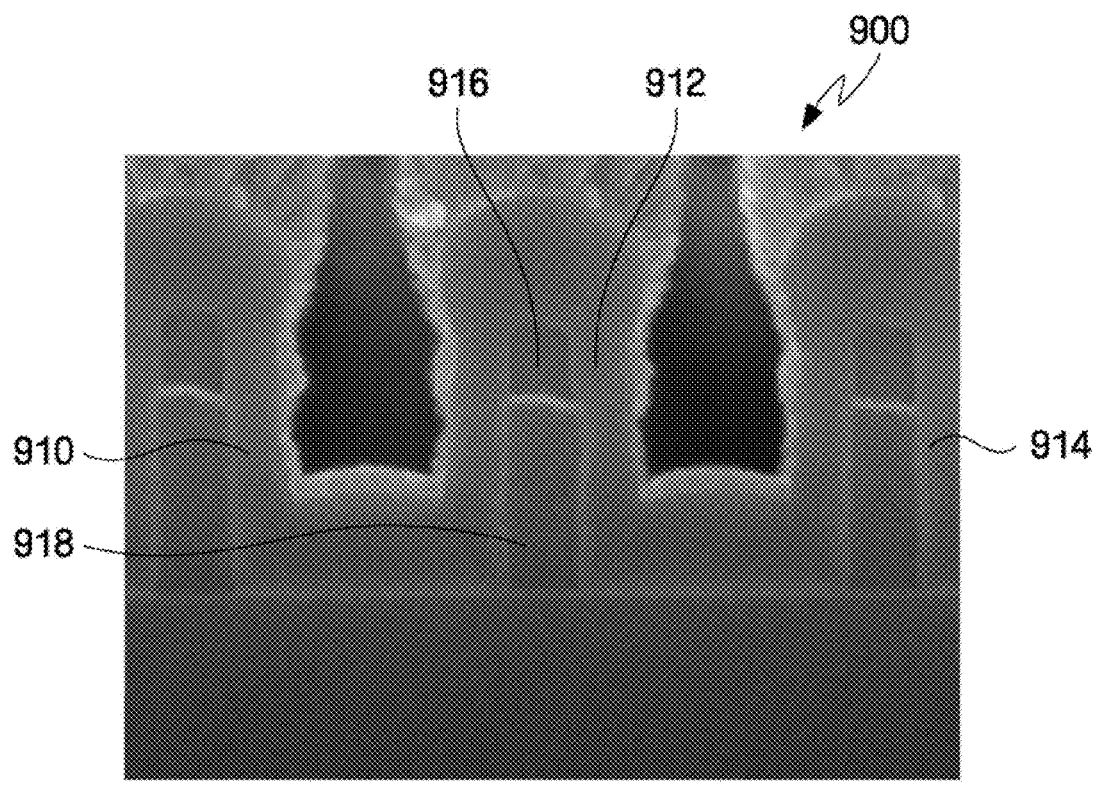
FIG. 9 shows a schematic diagram in vertical side view of an nFET structure in accordance with an exemplary embodiment of the present disclosure.

Turning now to FIG. 9, a semiconductor nFET structure is indicated generally by the reference numeral 900, shown here in side view. The nFET 900 is at the same processing stage as the pFET 800 of FIG. 8. The nFET 900 includes like spacers 910, 912 and 914, spaced substantially equally apart; a gate 916 disposed to the right of the spacer 910 and directly to the left of the spacer 912, where the gate has a height of about 41.0 nm; and a gate 918 disposed directly below the gate 916, the gate 918 having a width of about 39.0 nm.

Figure 10:
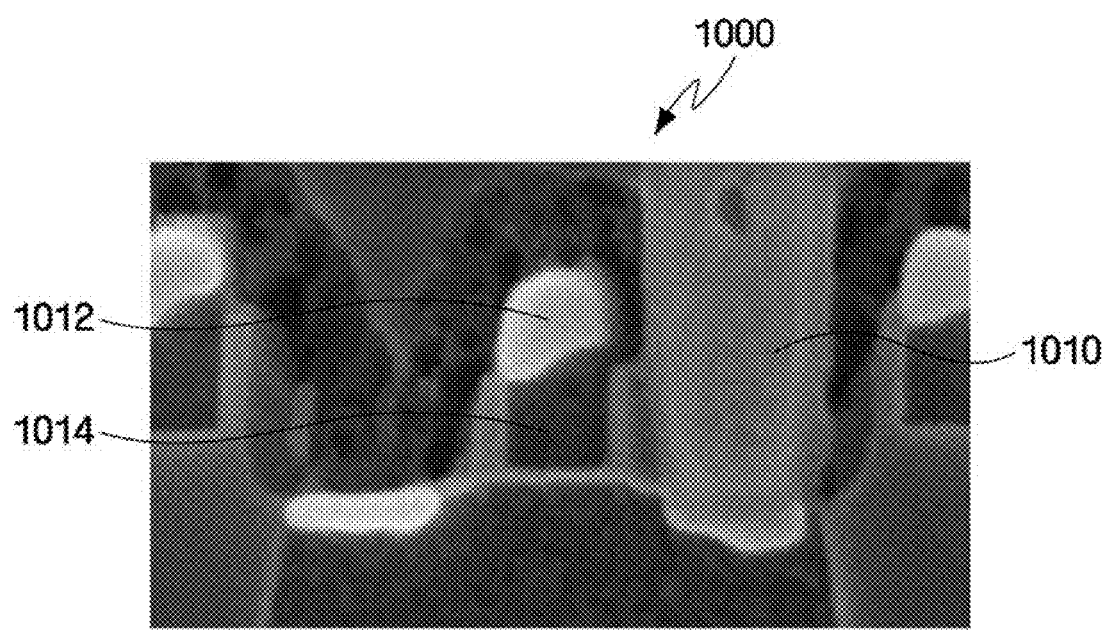
FIG. 10 shows a schematic diagram in vertical side view of a pFET structure for physical failure analysis (PFA) in accordance with an exemplary embodiment of the present disclosure.

As shown in FIG. 10, a semiconductor pFET structure is indicated generally by the reference numeral 1000, shown here in a side view for physical failure analysis (PFA). The pFET 1000 includes a drop contact 1010, a gate 1012 disposed near the contact, and a pFET gate 1014 directly below the gate.

Figure 11:
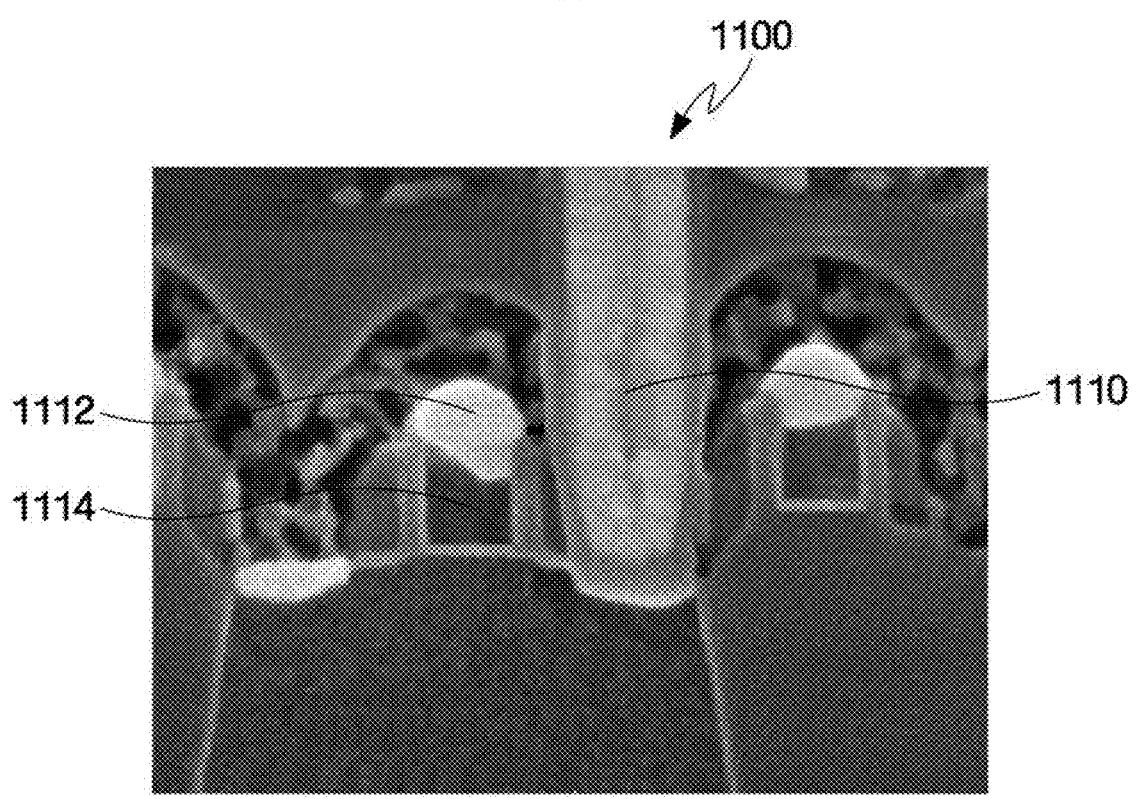
FIG. 11 shows a schematic diagram in vertical side view of an nFET structure for physical failure analysis (PFA) in accordance with an exemplary embodiment of the present disclosure.

Turning to FIG. 11, a semiconductor nFET structure is indicated generally by the reference numeral 1100, shown here in side view for PFA. The nFET 1100 is at the same processing stage as the pFET 1000 of FIG. 10. The nFET 1100 includes a drop contact 1110, a gate 1111 and a gate 1112 disposed thereon. The gate 1112 is disposed about 10.6 nm to the left of the contact 1110. The contact 1110 is about 84.9 nm wide near its top, and about 78.5 nm wide at spacer level near the gate 1112. Here, the nFET gate is about 43.4 nm wide. For comparison, a neighboring pFET gate is only about 39.8 nm wide. Thus, the contact 1110 to gate 1112 may exhibit a contact to gate short. This is mainly because the relative shapes of nFET and pFET gate structures change due to source/drain (S/D) implant differences, particularly at S/D ion-implantation (I/I) on the nFET.

Figure 12:
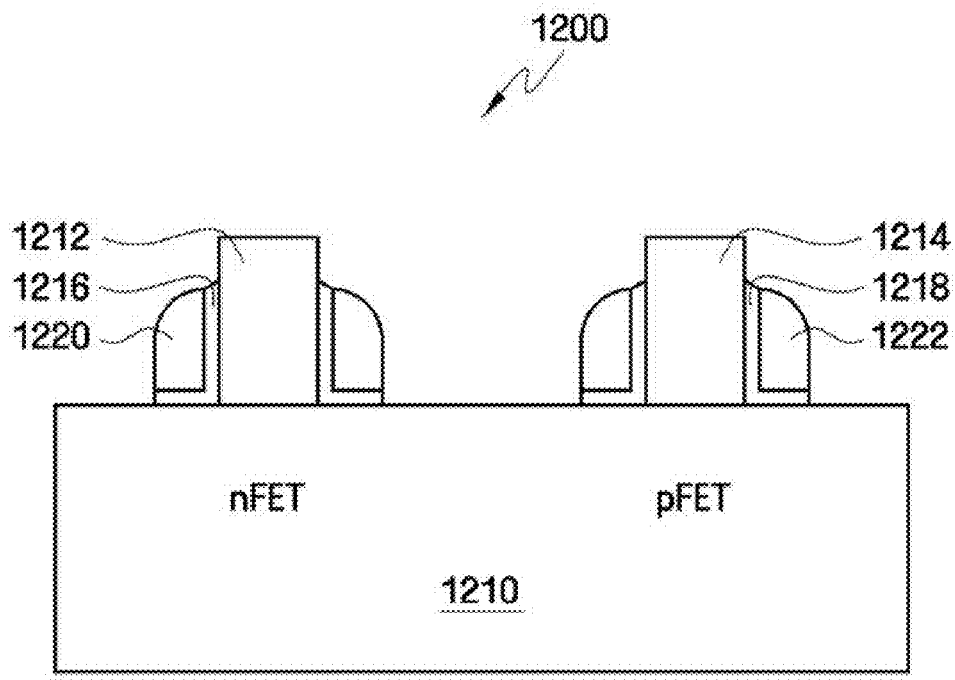
FIG. 12 shows a schematic diagram in vertical side view of a CMOS structure in accordance with an exemplary embodiment of the present disclosure.

Turning now to FIG. 12, a semiconductor structure during gate formation is indicated generally by the reference numeral 1200, shown here in side view. The structure 1200 includes a substrate 1210; an nFET portion including an nFET gate (n-gate) 1212, an nFET oxide (O) layer 1216 and an nFET spacer 1220; and a pFET portion including a pFET gate (p-gate) 1214, a pFET oxide (O) layer 1218 and a pFET spacer 1222.

Figure 13:
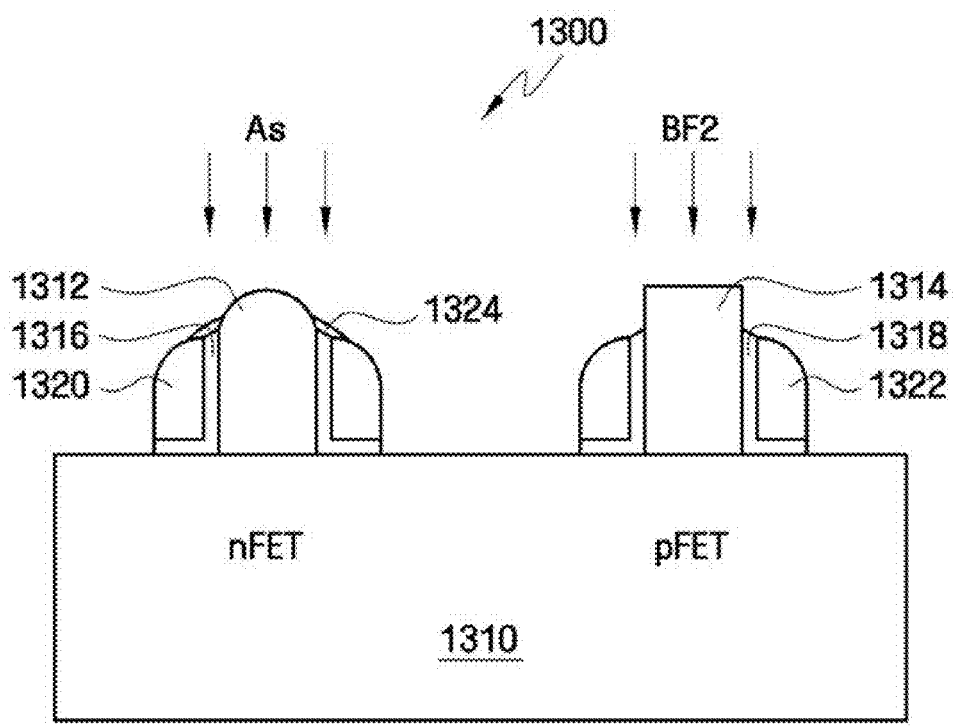
FIG. 13 shows a schematic diagram in vertical side view of a CMOS structure during source/drain ion-implantation in accordance with an exemplary embodiment of the present disclosure.

As shown in FIG. 13, a semiconductor structure during source/drain ion-implantation is indicated generally by the reference numeral 1300, shown here in side view. The structure 1300 includes a substrate 1310; an nFET portion including an n-gate 1312, an nFET oxide layer 1316 and an nFET spacer 1320; and a pFET portion including a p-gate 1314, a pFET oxide layer 1318 and a pFET spacer 1322. During ion-implantation (I/I), arsenic (As) is implanted in the nFET, and boron di-fluoride (BF2) is implanted in the pFET. Unfortunately, the As is rather heavy, and tends to round the top edges of the nFET gate (n-gate) 1312, displacing some of the NiSi material downwards to form stringers 1324.

Figure 14:
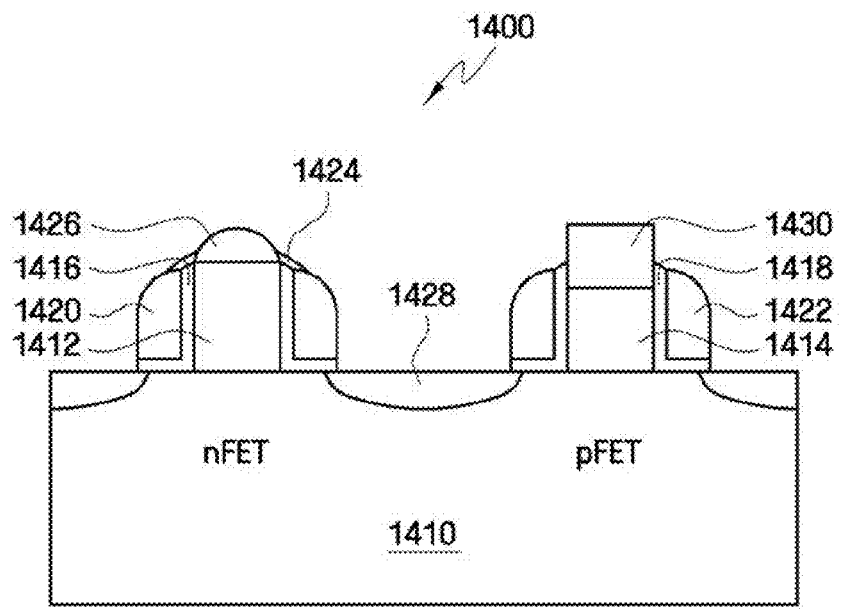
FIG. 14 shows a schematic diagram in vertical side view of a CMOS structure during silicide formation in accordance with an exemplary embodiment of the present disclosure.

Turning to FIG. 14, a semiconductor structure during silicide formation is indicated generally by the reference numeral 1400, shown in side view. The structure 1400 includes a substrate 1410; an nFET portion including an n-gate 1412, an nFET oxide layer 1416, an nFET spacer 1420, and a displaced NiSi stringer 1424; and a pFET portion including a p-gate 1414, a pFET oxide layer 1418, and a pFET spacer 1422. During silicide formation, an nFET silicide contact portion 1426 is formed on the n-gate gate, a pFET silicide contact portion is formed on the p-gate gate, and a silicide region 1428 is formed in the substrate between the nFET and the pFET. Here, the n-gate silicide contact is rounded in conformance with the rounded n-gate underneath it. In addition, silicide may also cover the displaced NiSi stringer 1424.

Figure 15:
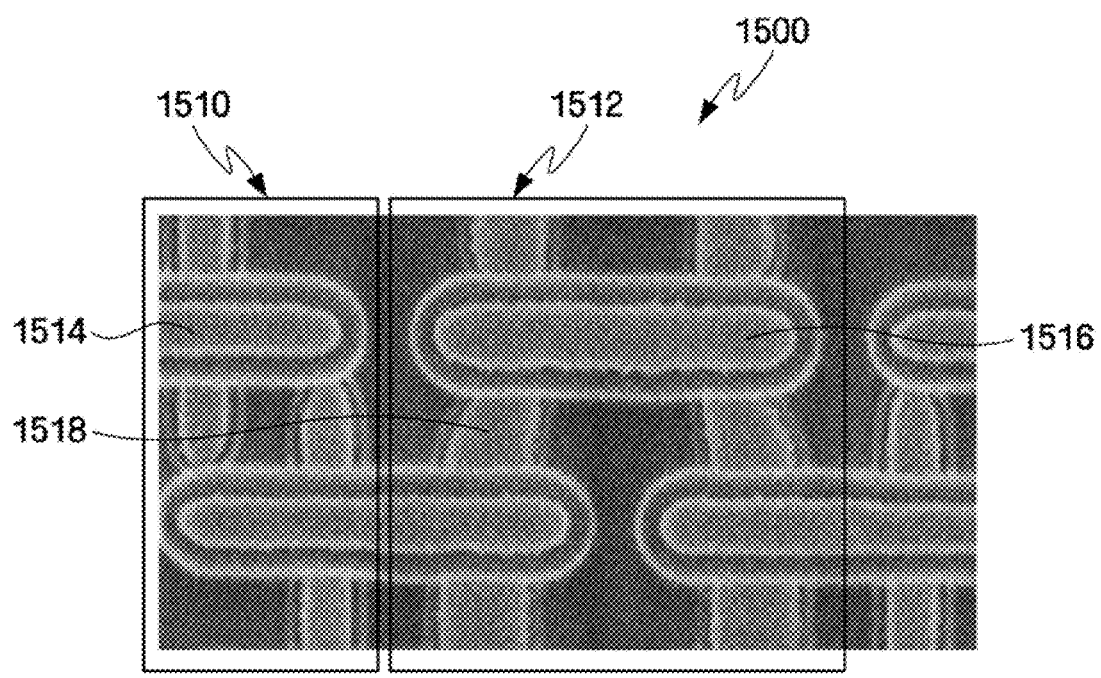
FIG. 15 shows a schematic diagram in horizontal top view of a semiconductor structure after silicide formation in accordance with an exemplary embodiment of the present disclosure.

Turning now to FIG. 15, a semiconductor structure after silicide formation is indicated generally by the reference numeral 1500, shown here in a top view. The structure 1500 includes a pFET portion 1510 and an nFET portion 1512. The pFET includes a p-gate 1514 having a width of about 64 nm, while the nFET includes an n-gate 1516 having a width of about 84 nm, and diffusion or active silicon register (RX) areas 1518. Thus, the As, which is relatively heavy, causes the n-gate to partially collapse during implantation, leading to wider n-gate width than p-gate width and a greater number of silicide bump defects in n-gate versus p-gate. Moreover, the resulting n-gate to contact short circuits are generally weaker than any p-gate to contact short circuits.

Figure 16:
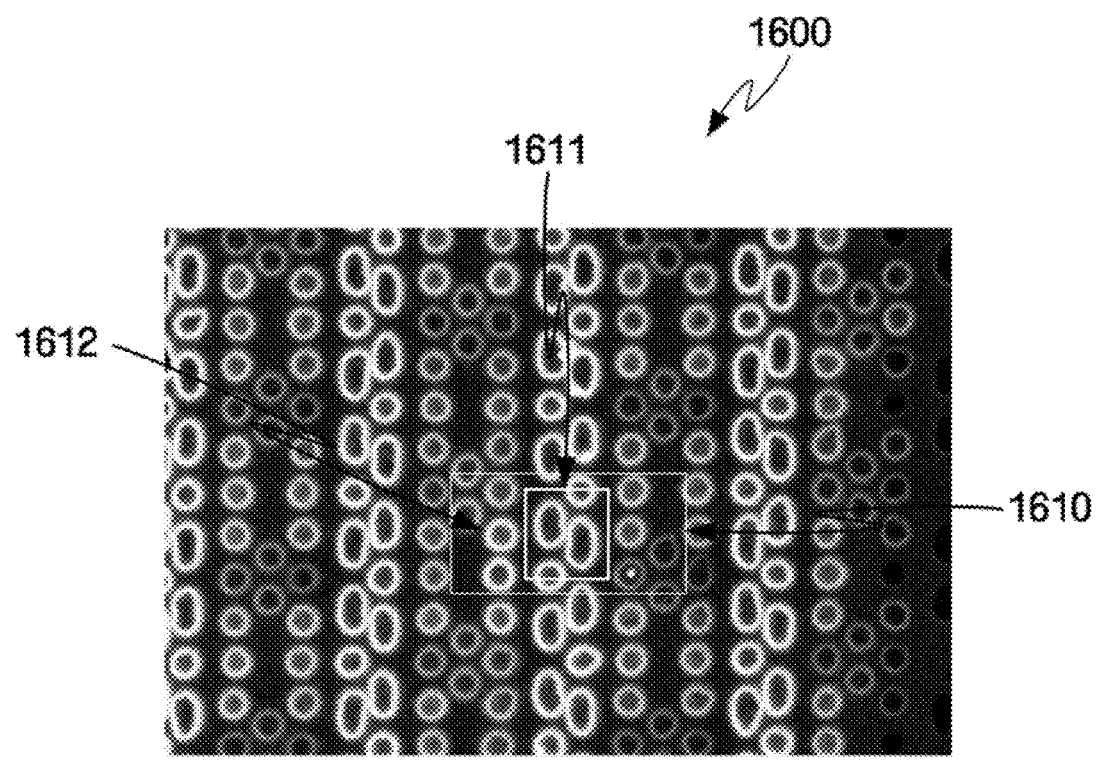
FIG. 16 shows a schematic diagram in horizontal top view of a semiconductor structure for PFA in accordance with an exemplary embodiment of the present disclosure.

As shown in FIG. 16, a semiconductor structure is indicated generally by the reference numeral 1600, shown here in a top view for PFA. The structure 1600 includes an nFET region 1610. The nFET region 1610 includes a plurality of bright via connectors (VC) 1611 at contact level, and a contact 1612. In this view, the increased brightness of the contact 1612 relative to other contacts indicates a contact to gate short circuit defect, which is typically to ground (GND) for n-gate, since the p-type substrate tap contact of the nFET is connected to $V_{SS}$ or GND, unlike an n-type well tap contact of a pFET connected to Vdd.

Figure 17:
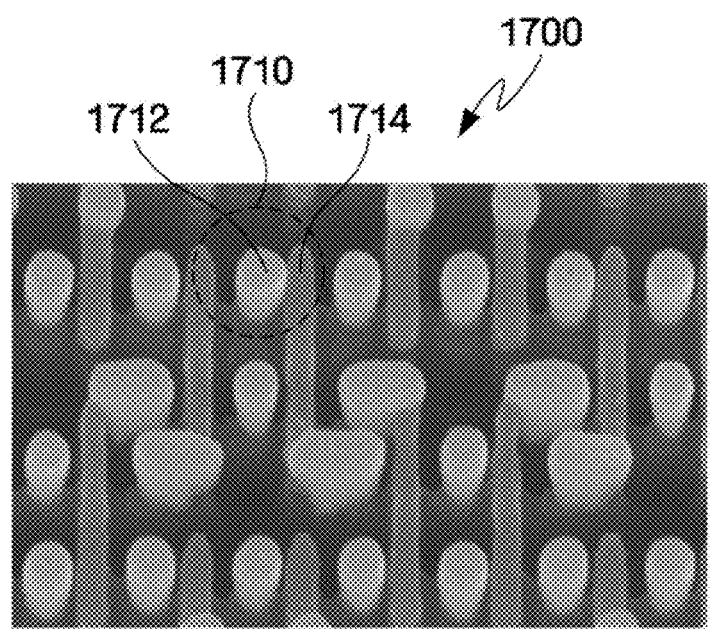
FIG. 17 shows a schematic diagram in wide-angle perspective top view of a semiconductor structure for PFA in accordance with an exemplary embodiment of the present disclosure.

Turning to FIG. 17, a semiconductor structure is indicated generally by the reference numeral 1700, shown here in a perspective top view for PFA. The structure 1700 includes an nFET region 1710. The nFET region 1710 includes a contact 1712 and an n-gate 1714. In this view, the cause of the contact to gate short appears to be the proximity of the contact 1712 to the n-gate 1714.

Figure 18:
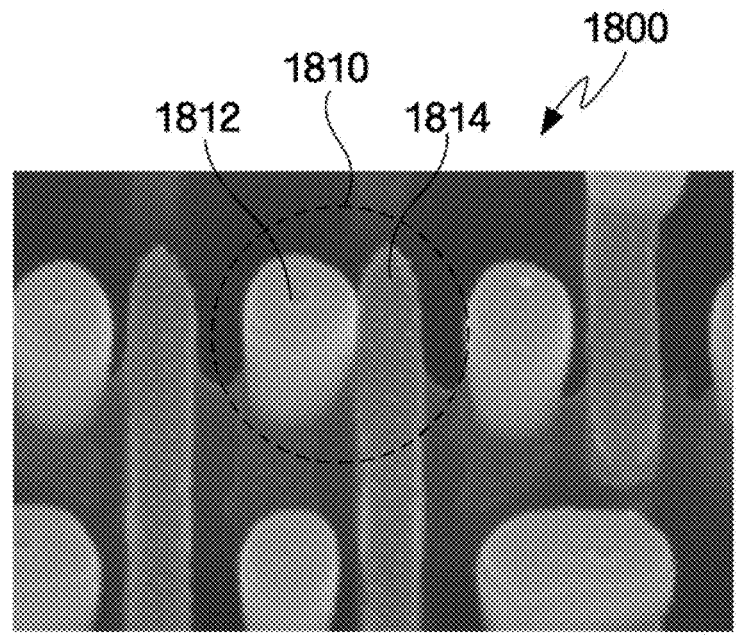
FIG. 18 shows a schematic diagram in narrow-angle perspective top view of a semiconductor structure for PFA in accordance with an exemplary embodiment of the present disclosure.

Turning now to FIG. 18, a semiconductor structure is indicated generally by the reference numeral 1800, shown here in a close-up perspective view for PFA. The structure 1800 includes an nFET region 1810. The nFET region 1810 includes a GND contact 1812 at contact level, and an n-gate 1814. In this close-up view, the cause of the contact to gate short is shown to be a critical gap reduction from contact misalignment and displaced stringer material between the GND contact 1812 and the n-gate 1814. That is, the gate stringer makes gate-contact shorts worse by causing additional gap reductions.

Figure 19:
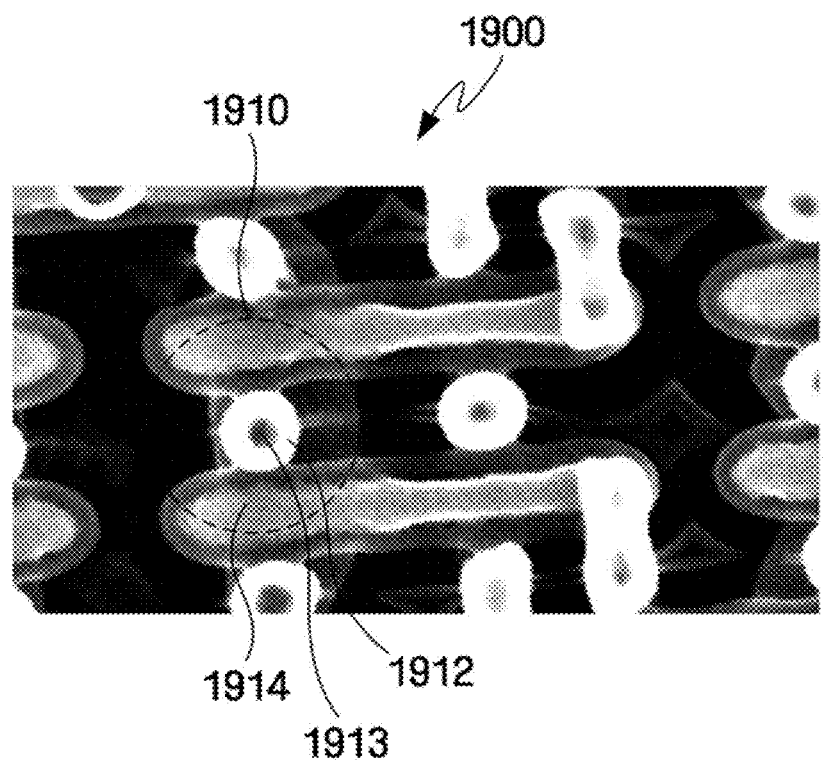
FIG. 19 shows a schematic diagram in wide-angle horizontal top view of a semiconductor structure for PFA in accordance with an exemplary embodiment of the present disclosure.

As shown in FIG. 19, a semiconductor structure is indicated generally by the reference numeral 1900, shown here in a top view for PFA. The structure 1900 includes an nFET region 1910. The nFET region 1910 includes a GND contact 1912 at contact level, and an elongated gate 1914. Here, the nFET end of the gate, which is adjacent to the contact 1912, is noticeably wider than the pFET end of the gate, which is disposed at the other end. In this view, the cause of the contact to gate short is shown to be a critical gap reduction from displaced stringer material from the n-gate 1914 towards the GND contact 1912. There is a W void 1913 in the center of the contact 1912. In this exemplary embodiment, the contact material is tungsten deposited by chemical vapor deposition (CVD).

Figure 20:
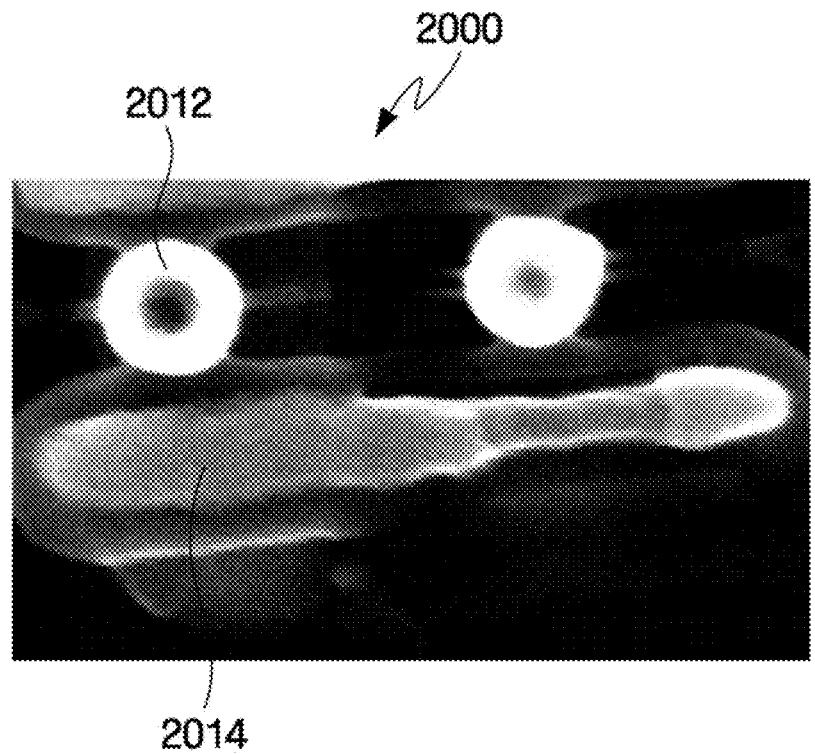
FIG. 20 shows a schematic diagram in narrow-angle horizontal top view of a semiconductor structure for PFA in accordance with an exemplary embodiment of the present disclosure.

Turning to FIG. 20, a semiconductor structure is indicated generally by the reference numeral 2000, shown here in a close-up top-down view for PFA. The structure 2000 includes a GND contact 2012 in short-circuit proximity to an n-gate portion of an elongated gate 2014. Here, the nFET end of the gate or n-gate, which is adjacent to the contact 2012, is noticeably wider in top-down view than the pFET end of the gate or p-gate, which is disposed at the other end. Thus, the cause of the GND contact to n-gate short is shown to be a critical gap reduction due to displaced NiSi material from the n-gate 2014 towards the GND contact 2012. The n-gate is more sensitive to contact-gate shorts than the p-gate.

Figure 21:
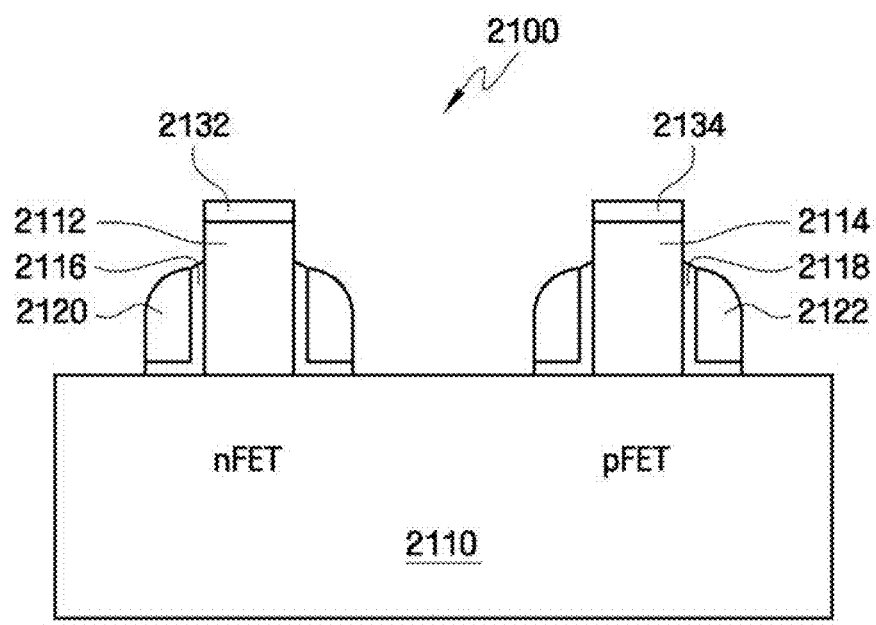
FIG. 21 shows a schematic diagram in vertical side view of a semiconductor structure with nitride cap during gate formation in accordance with an exemplary embodiment of the present disclosure.

Turning now to FIG. 21, a semiconductor structure with nitride cap during gate formation is indicated generally by the reference numeral 2100, shown here in side view. The structure 2100 includes a substrate 2110; an nFET portion including an nFET gate (n-gate) 2112, an nFET oxide (O) layer 2116 an nFET spacer 2120, and an nFET nitride cap 2132 disposed on the n-gate; and a pFET portion including a pFET gate (p-gate) 2114, a pFET oxide (O) layer 2118, a pFET spacer 2122, and a pFET nitride cap 2134 disposed on the p-gate.

Figure 22:
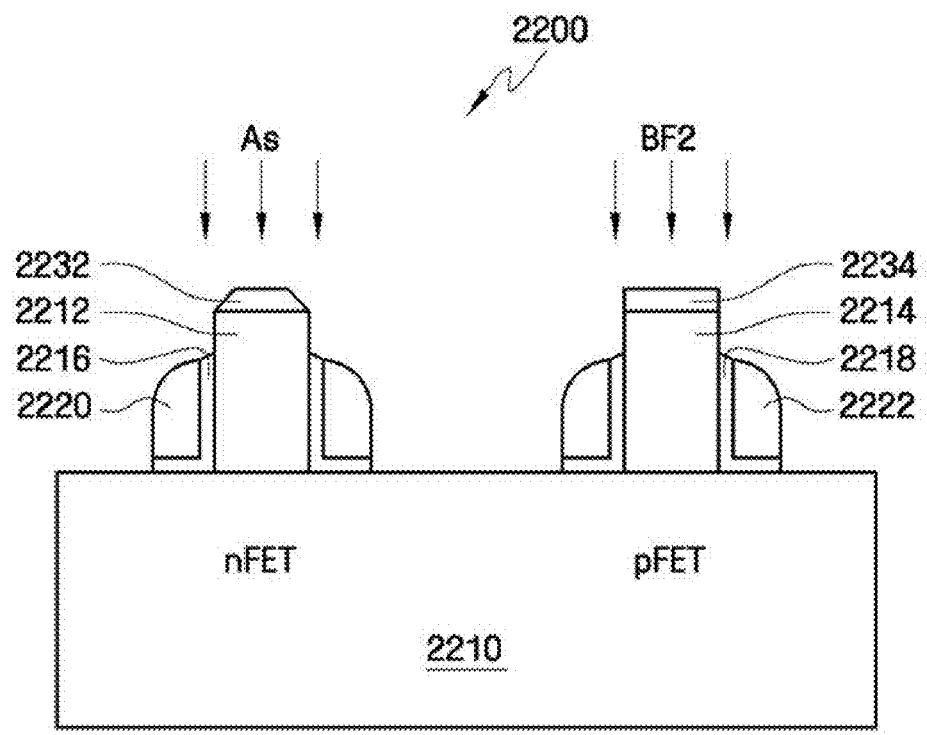
FIG. 22 shows a schematic diagram in vertical side view of a semiconductor structure with nitride cap during source/drain ion-implantation in accordance with an exemplary embodiment of the present disclosure.

As shown in FIG. 22, a semiconductor structure with nitride cap during source/drain ion-implantation is indicated generally by the reference numeral 2200, shown here in side view. The structure 2200 includes a substrate 2210; an nFET portion including an n-gate 2212, an nFET oxide layer 2216, an nFET spacer 2220, and an nFET nitride cap 2232 on the n-gate; and a pFET portion including a p-gate 2214, a pFET oxide layer 2218, a pFET spacer 2222, and a pFET nitride cap 2234 on the p-gate. During ion-implantation (I/I), arsenic (As) is implanted in the nFET, and boron di-fluoride (BF2) is implanted in the pFET. The As is rather heavy, so it tends to round the top edges of the nFET nitride cap 2232. Here, the nFET nitride cap protects the n-gate 2212 and prevents rounding thereof. Thus, no undesirable NiSi stringers are allowed to form.

Figure 23:
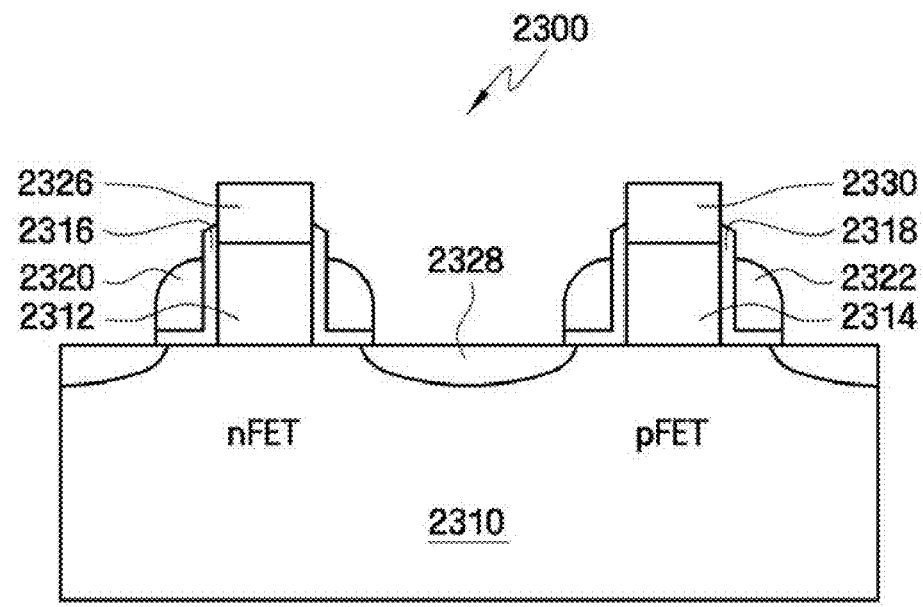
FIG. 23 shows a schematic diagram in vertical side view of a semiconductor structure with nitride cap during nitride etch and silicide formation in accordance with an exemplary embodiment of the present disclosure.

Turning to FIG. 23, a semiconductor structure with nitride cap during nitride etch and silicide formation is indicated generally by the reference numeral 2300, shown in side view. The structure 2300 includes a substrate 2310; an nFET portion including an n-gate 2312, an nFET oxide layer 2316, an nFET spacer 2320, and an n-gate silicide contact 2326; and a pFET portion including a p-gate 2314, a pFET oxide layer 2318, a pFET spacer 2322, and a p-gate silicide contact 2330. During silicide formation, the silicide contact 2326 formed on the n-gate 2312 is substantially rectangular in conformance with the preserved n-gate as protected by the nitride cap. In addition, a silicide region 2328 is formed in the substrate between the nFET and the pFET.

Advantages of transistor formation using the nitride capping process sequence may include substantially the same n-gate and p-gate widths, reduced silicide bump defects, a reduction in contact-n-gate shorts, a wider contact process margin, and SRAM yield increases. It shall be understood that some device optimization is desirable in order to fully realize these advantages, particularly where the gate receives no S/D implantation. Thus, such device optimization may be realized with polysilicon pre-doping and ion-implantation process (IIP) condition adjustment to substantially prevent polysilicon depletion and/or polysilicon resistance increases.

Figure 24:
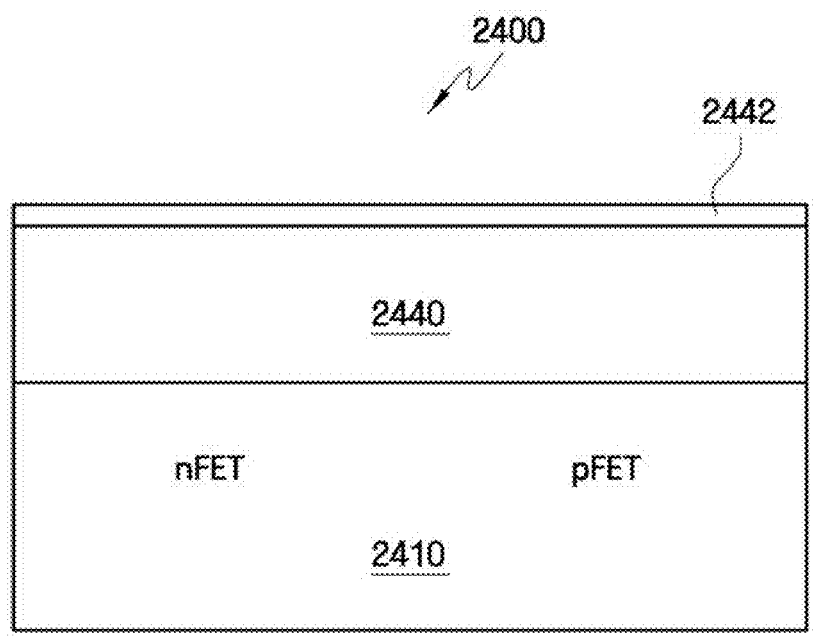
FIG. 24 shows a schematic diagram in vertical side view of a low-power (LP) 45-nm semiconductor structure after polysilicon and hard mask deposition in accordance with an exemplary embodiment of the present disclosure.

Turning now to FIG. 24, a low-power (LP) 45 nm semiconductor structure after polysilicon and hard mask deposition is indicated generally by the reference numeral 2400, shown here in side view. The structure 2400 includes a substrate 2410 having an nFET region (e.g., p-type substrate) and a pFET region (e.g., n-type well in p-type substrate). A polycrystalline silicon (poly) layer 2440 is deposited directly onto the substrate, and a hard mask (HM) layer 2442 is deposited directly onto the poly.

Figure 25:
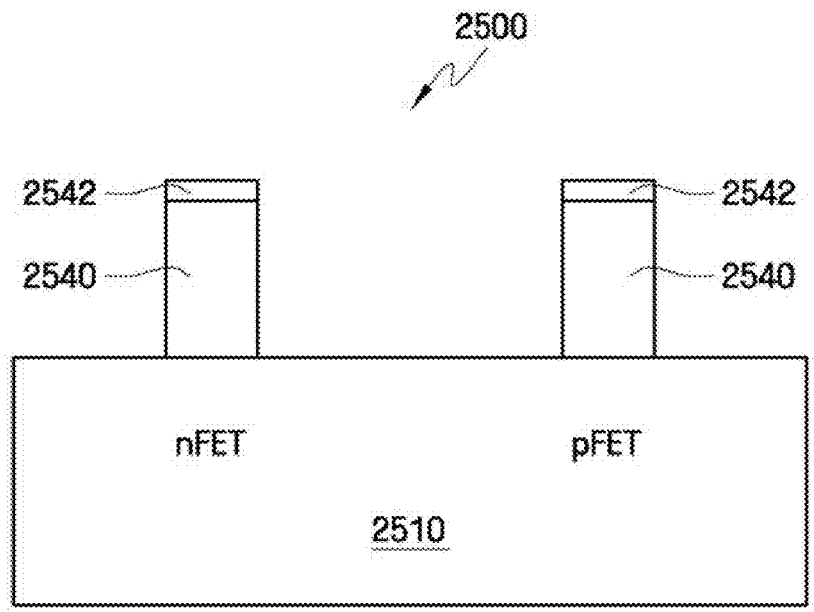
FIG. 25 shows a schematic diagram in vertical side view of an LP 45-nm semiconductor structure after polysilicon conductor gate etch with hard mask in accordance with an exemplary embodiment of the present disclosure.

As shown in FIG. 25, a low-power 45 nm semiconductor structure after polysilicon conductor gate etch with hard mask is indicated generally by the reference numeral 2500, shown here in side view. The structure 2500 includes a substrate 2510 having nFET and pFET regions, an etched gate 2540 on each region, and an etched hard mask (HM) portion 2542 on each gate.

Figure 26:
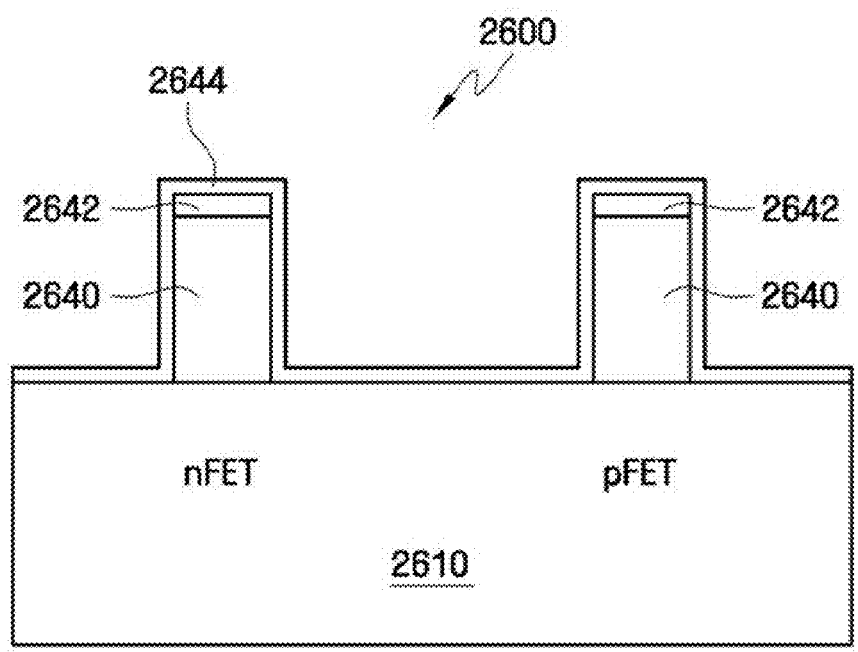
FIG. 26 shows a schematic diagram in vertical side view of an LP 45-nm semiconductor structure after re-oxidation (reox), first spacer (sp1) low temperature oxidation (LTO) and extension/halo implantation in accordance with an exemplary embodiment of the present disclosure.

Turning to FIG. 26, a low-power 45 nm semiconductor structure after re-oxidation (reox), first spacer (sp1) low temperature oxidation (LTO) and extension/halo implantation is indicated generally by the reference numeral 2600, in side view. The structure 2600 includes a substrate 2610 having nFET and pFET regions, an etched gate 2640 on each region, an etched HM portion 2642 on each gate, and a first spacer (spacer1) oxide layer on top of everything.

Figure 27:
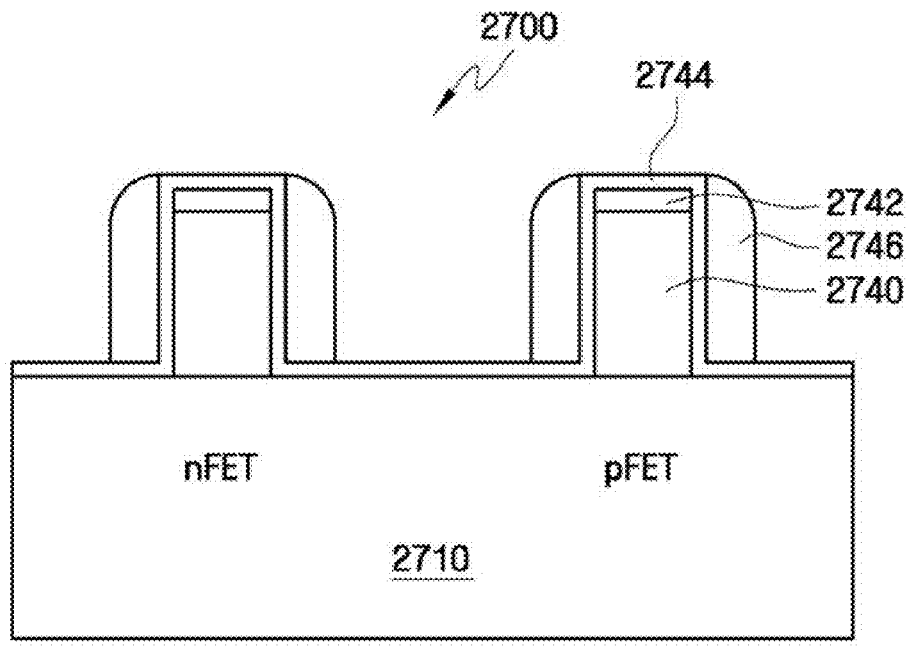
FIG. 27 shows a schematic diagram in vertical side view of an LP 45-nm semiconductor structure after second spacer formation in accordance with an exemplary embodiment of the present disclosure.

Turning now to FIG. 27, a low-power 45 nm semiconductor structure with a second spacer is indicated generally by the reference numeral 2700, shown in side view. The structure 2700 includes a substrate 2710 having nFET and pFET regions, an etched gate 2740 on each region, an etched HM portion 2742 on each gate, a spacer1 oxide layer on top, and second spacers (spacer2) 2746 outside the oxide around the perimeter of each gate.

Figure 28:
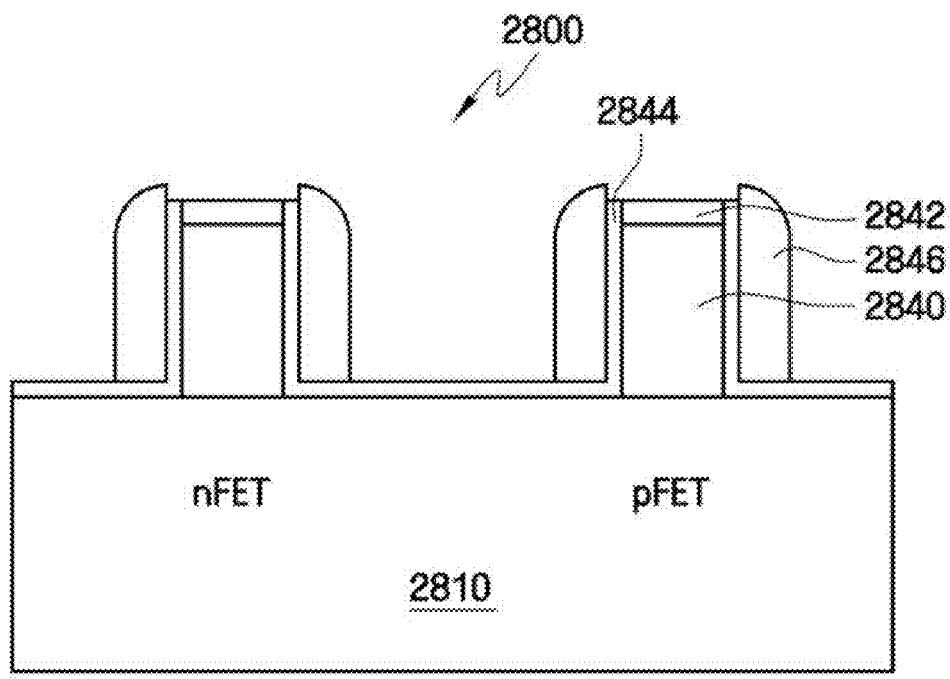
FIG. 28 shows a schematic diagram in vertical side view of an LP 45-nm semiconductor structure after source/drain (S/D) ion-implantation (I/I) and deglazing in accordance with an exemplary embodiment of the present disclosure.

As shown in FIG. 28, a low-power 45 nm semiconductor structure after source/drain (S/D) ion-implantation (I/I) and deglazing is indicated generally by the reference numeral 2800, in side view. The structure 2800 includes a substrate 2810 having nFET and pFET regions, an etched gate 2840 on each region, an etched HM portion 2842 on each gate, spacer1 oxide spacers 2844 on the substrate and around the perimeter of each gate, and spacer2 spacers 2846 outside the oxide around the perimeter of each gate.

Figure 29:
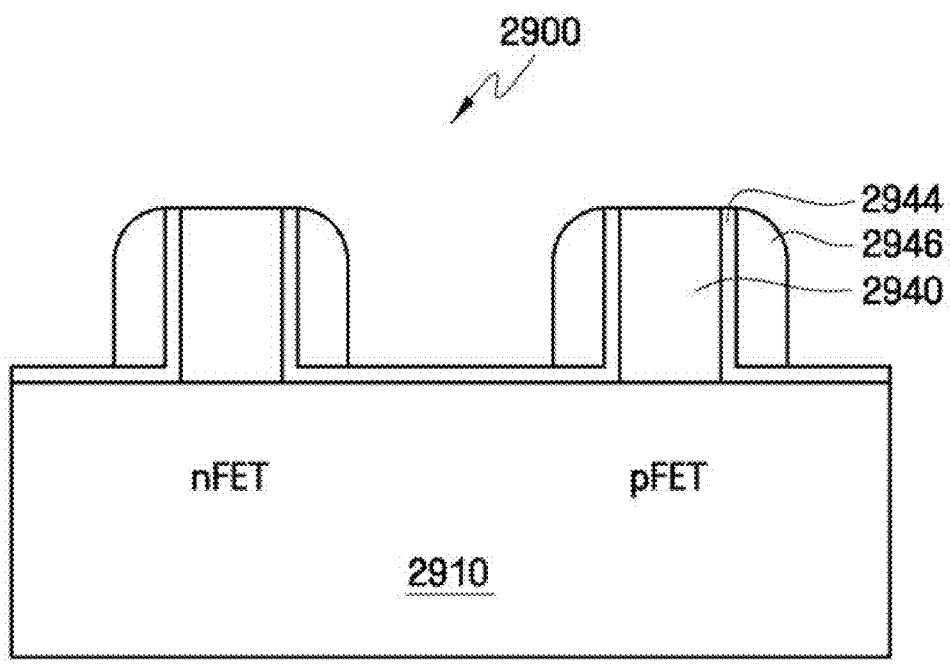
FIG. 29 shows a schematic diagram in vertical side view of an LP 45-nm semiconductor structure after hard mask (HM) nitride etching in accordance with an exemplary embodiment of the present disclosure.

Turning to FIG. 29, a low-power 45 nm semiconductor structure after hard mask (HM) nitride etching is indicated generally by the reference numeral 2900, shown again in side view. The structure 2900 includes a substrate 2910 having nFET and pFET regions, an etched gate 2940 on each region, spacer1 oxide spacers 2944 on the substrate and around the perimeter of each gate, and spacer2 spacers 2946 outside the oxide around the perimeter of each gate.

Figure 30:
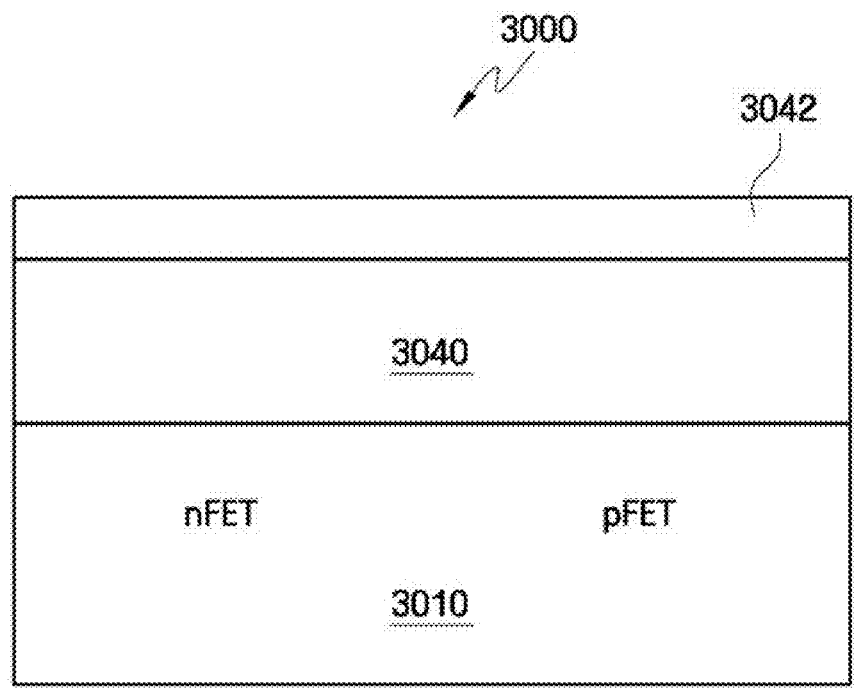
FIG. 30 shows a schematic diagram in vertical side view of a standard-power 45-nm semiconductor structure after polysilicon and hard mask deposition in accordance with an exemplary embodiment of the present disclosure.

Turning now to FIG. 30, a standard foundry (SF, or standard power) 45 nm semiconductor structure after polysilicon and hard mask deposition is indicated generally by the reference numeral 3000, shown here in side view. The structure 3000 includes a substrate 3010 having an nFET region (e.g., p-type substrate) and a pFET region (e.g., n-type well in p-type substrate). A polycrystalline silicon (poly) layer 3040 is deposited directly onto the substrate, and a hard mask (HM) layer 3042 is deposited directly onto the poly.

Figure 31:
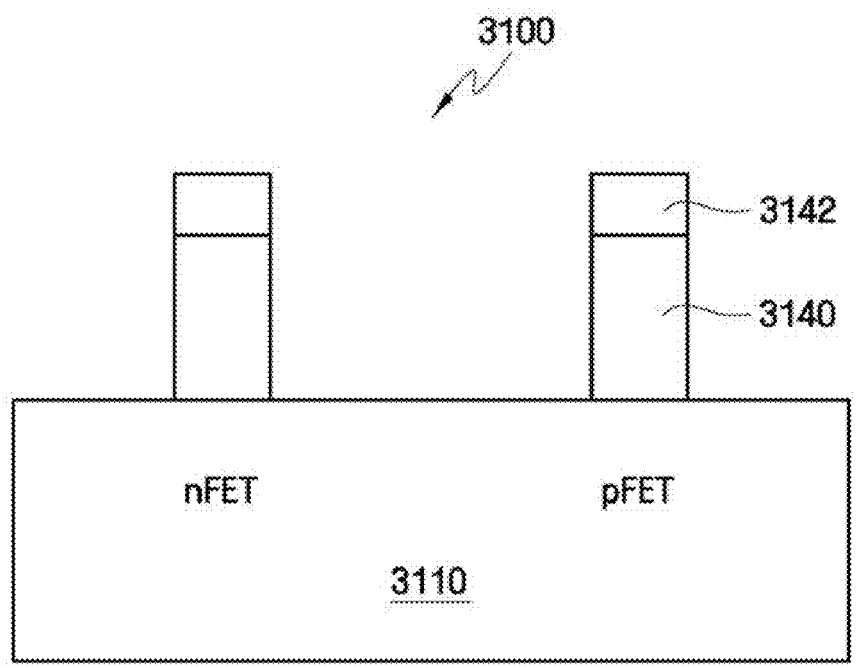
FIG. 31 shows a schematic diagram in vertical side view of a standard-power 45-nm semiconductor structure after polysilicon conductor gate etch with hard mask in accordance with an exemplary embodiment of the present disclosure.

As shown in FIG. 31, a standard foundry 45 nm semiconductor structure after polysilicon conductor gate etch with hard mask is indicated generally by the reference numeral 3100, shown here in side view. The structure 3100 includes a substrate 3110 having nFET and pFET regions, an etched gate 3140 on each region, and an etched hard mask (HM) portion 3142 on each gate.

Figure 32:
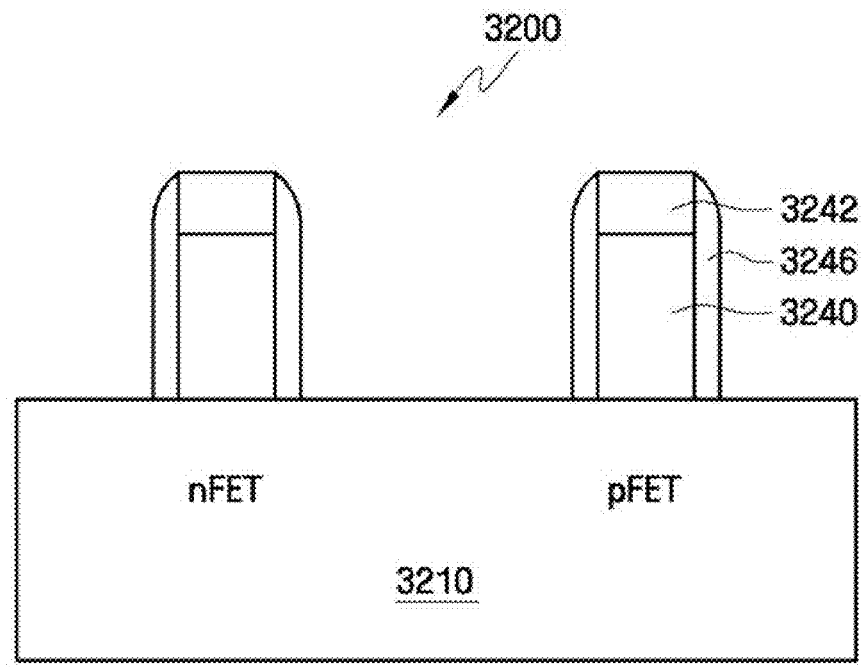
FIG. 32 shows a schematic diagram in vertical side view of a standard-power 45-nm semiconductor structure after re-oxidation (reox) and/or low temperature oxidation (LTO) and epitaxially grown SiGe (eSiGe) spacer addition in accordance with an exemplary embodiment of the present disclosure.

Turning to FIG. 32, a standard foundry 45 nm semiconductor structure after re-oxidation (reox) and/or low temperature oxidation (LTO) and epitaxially grown SiGe (eSiGe) spacer addition is indicated generally by the reference numeral 3200, in side view. The structure 3200 includes a substrate 3210 having nFET and pFET regions, an etched gate 3240 on each region, an etched HM portion 3242 on each gate, and an eSiGe spacer around the perimeter of the gate and HM portions.

Figure 33:
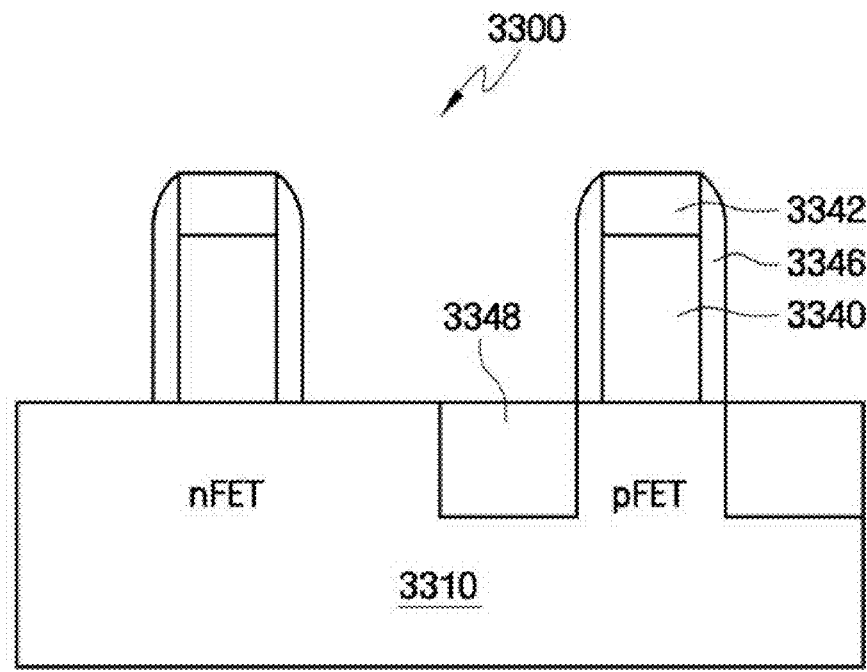
FIG. 33 shows a schematic diagram in vertical side view of a standard-power 45-nm semiconductor structure after silicon (Si) etch and eSiGe deposition in accordance with an exemplary embodiment of the present disclosure.

Turning now to FIG. 33, a standard foundry 45 nm semiconductor structure with silicon (Si) etch and eSiGe deposition is indicated generally by the reference numeral 3300, shown in side view. The structure 3300 includes a substrate 3310 having nFET and pFET regions, an etched gate 3340 on each region, an etched HM portion 3342 on each gate, eSiGe spacers 3346 around the perimeter of each gate with HM, and eSiGe halo extensions 3348 disposed in the substrate around the pFET gate (p-gate).

Figure 34:
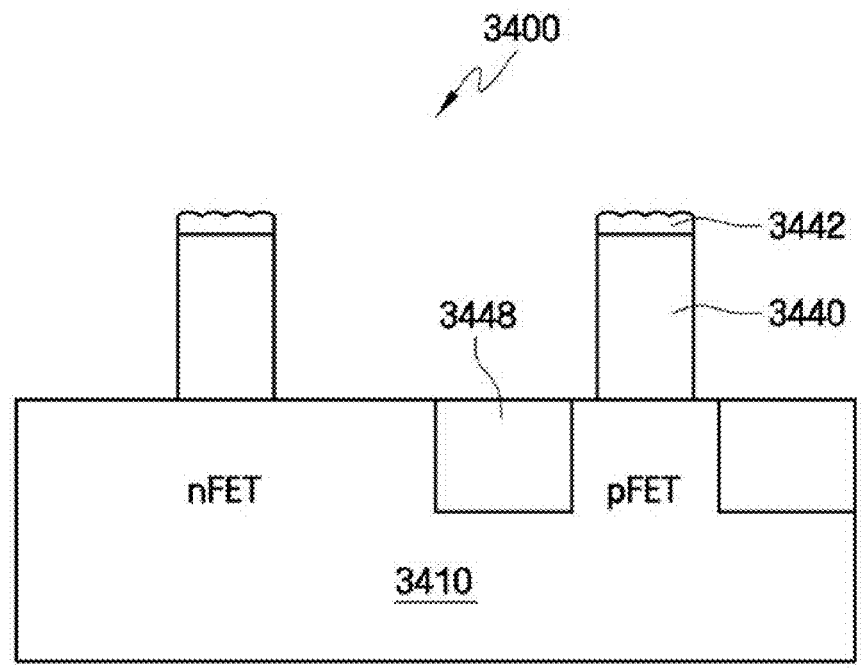
FIG. 34 shows a schematic diagram in vertical side view of a standard-power 45-nm semiconductor structure after isotropic dry etch or HOT POS strip in accordance with an exemplary embodiment of the present disclosure.

As shown in FIG. 34, a standard foundry 45 nm semiconductor structure after isotropic dry etch or hot phosphate rinsing to strip nitride (HOT POS Strip) is indicated generally by the reference numeral 3400, in side view. The structure 3400 includes a substrate 3410 having nFET and pFET regions, an etched gate 3440 on each region, an etched HM portion 3442 on each gate, and eSiGe halo extensions 3448 disposed in the substrate around the base of the pFET gate (p-gate) 3440.

Figure 35:
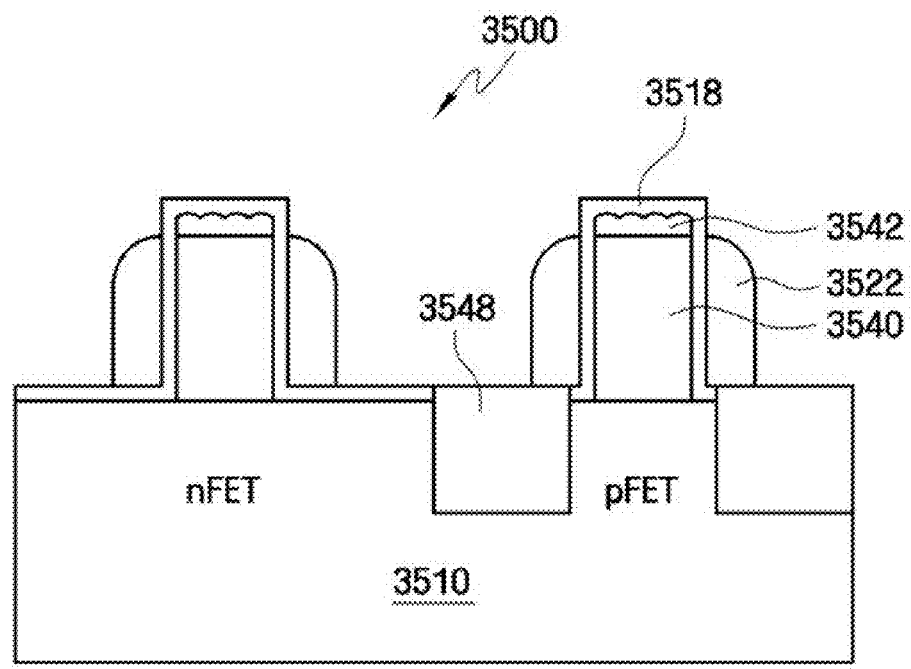
FIG. 35 shows a schematic diagram in vertical side view of a standard-power 45-nm semiconductor structure after low temperature oxidation (LTO), spacer2 addition, and source/drain ion-implantation in accordance with an exemplary embodiment of the present disclosure.

Turning to FIG. 35, a standard foundry 45 nm semiconductor structure after low temperature oxidation (LTO), spacer2 addition, and source/drain ion-implantation is indicated generally by the reference numeral 3500, shown again in side view. The structure 3500 includes a substrate 3510 having nFET and pFET regions, an etched gate 3540 on each region, an etched HM portion 3542 on each gate, eSiGe halo extensions 3548 disposed in the substrate around the base of the pFET gate (p-gate) 3540, spacer1 oxide layer spacers 3544 on the substrate and each gate, and spacer2 spacers 3546 outside the oxide around the perimeter of each gate. The remainder of the standard foundry 45 nm processing is similar to the low-power 45 nm processing of FIGS. 28 and 29, so duplicate description may be omitted.

Figure 36:
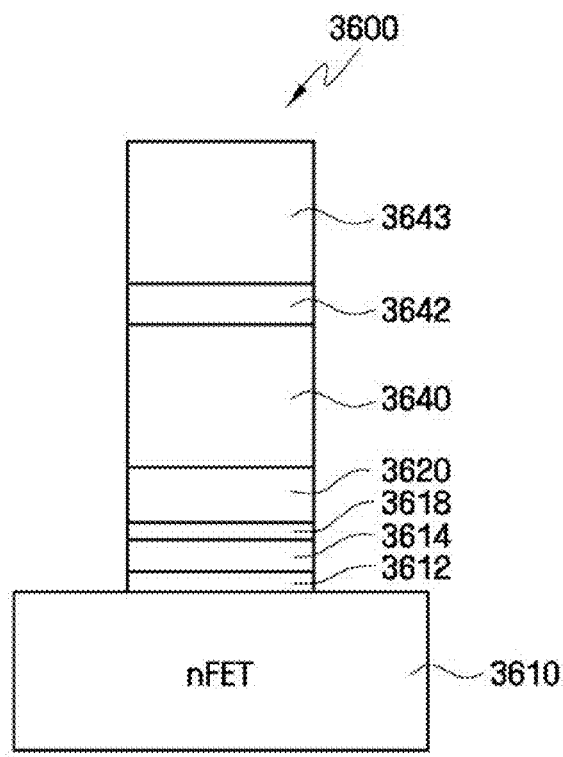
FIG. 36 shows a schematic diagram in vertical side view of a low-power (LP) 32-nm nFET semiconductor structure in accordance with an exemplary embodiment of the present disclosure.

Turning now to FIG. 36, a low-power (LP) 32 nm nFET semiconductor structure is indicated generally by the reference numeral 3600, shown here in a vertical side view. The nFET structure 3600 includes a substrate 3610 having an nFET region (e.g., p-type substrate), an ultraviolet (UV) oxide layer 3612 on the substrate, a hafnium dioxide (HfO2) layer 3614 on the UV oxide, an aluminum oxide (Al2O3) layer 3618 on the HfO2, a ceramic or titanium nitride (TiN) layer 3620 on the Al2O3, a polycrystalline silicon (poly) layer 3640 on the TiN, an oxide or cap layer 3642 on the poly, and a resist layer 3643 on the cap. Here, the cap layer 3642 may be obtained using an oxide hard mask (HM). In one exemplary embodiment, the poly layer 3640 is about 1000 angstroms (A) thick, the TiN layer 3620 is about 100 A thick, the Al2O3 layer 3618 is about 8 A thick, and the HfO2 layer 3614 is about 22 A thick. In alternate embodiments, either oxide and/or nitride may be used as the cap material. In addition, a metal gate structure may be used rather than poly in substantially the same process.

Figure 37:
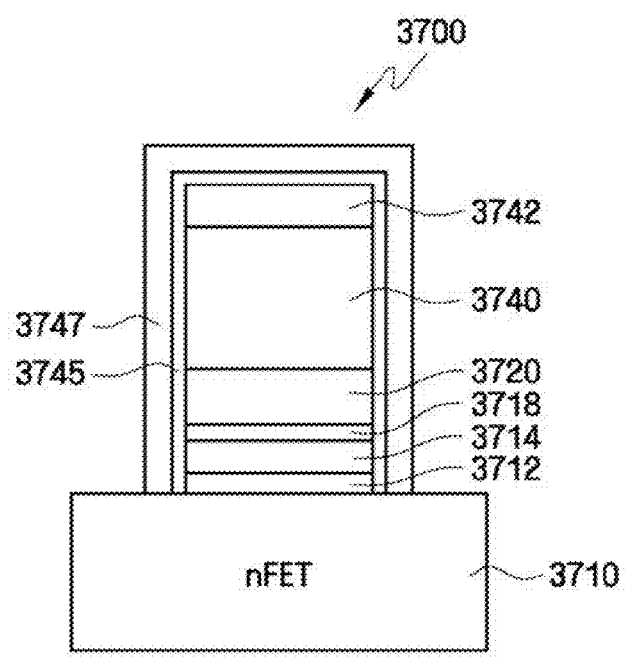
FIG. 37 shows a schematic diagram in vertical side view of an LP 32-nm nFET semiconductor structure after molecular layer deposition (MLD) of nitride in accordance with an exemplary embodiment of the present disclosure.

As shown in FIG. 37, a LP 32 nm nFET semiconductor structure is indicated generally by the reference numeral 3700, shown here in a vertical side view. The nFET structure 3700 is similar to the nFET structure 3600 at a subsequent processing stage, so duplicate description may be omitted. The nFET structure 3700 differs in that the resist has been removed, a molecular layer deposition (MLD) nitride layer 3745 covers the nFET structure, and a plasma enhanced (PE) oxide layer 3747 covers the nitride. In one exemplary embodiment, the MLD nitride layer is about 5 nm thick, and the PE oxide layer is about 28 nm thick.

Figure 38:
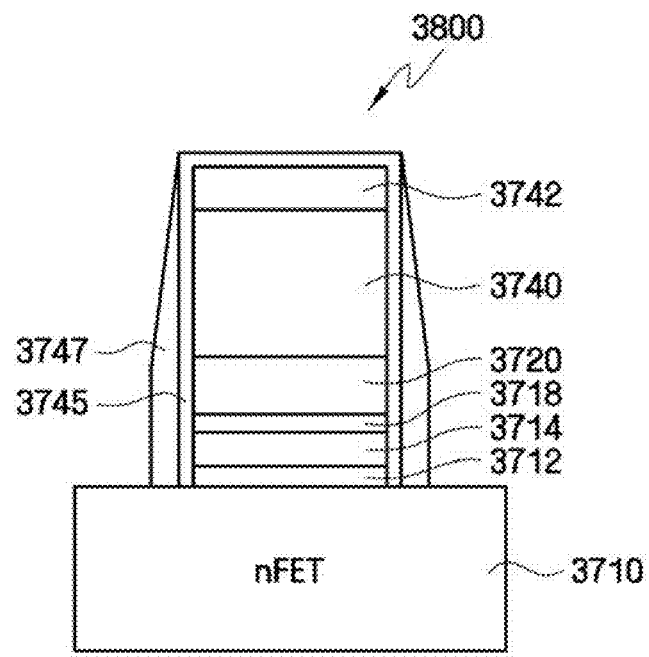
FIG. 38 shows a schematic diagram in vertical side view of a low-power (LP) 32-nm nFET semiconductor structure after etch of first spacer in accordance with an exemplary embodiment of the present disclosure.

Turning to FIG. 38, a LP 32 nm nFET semiconductor structure is indicated generally by the reference numeral 3800, in vertical side view. The nFET structure 3800 is similar to the nFET structures 3600 and 3700 at a subsequent processing stage, so duplicate description may be omitted. In the nFET structure 3800, a spacer1 etch has been used to completely etch the layer 3747 from the top surface of the structure, and to partially etch it from the sides, with an increasing thickness remaining towards the base of the structure. In addition, the second layer 3745 may be slightly reduced in thickness at the top surface of the structure.

Figure 39:
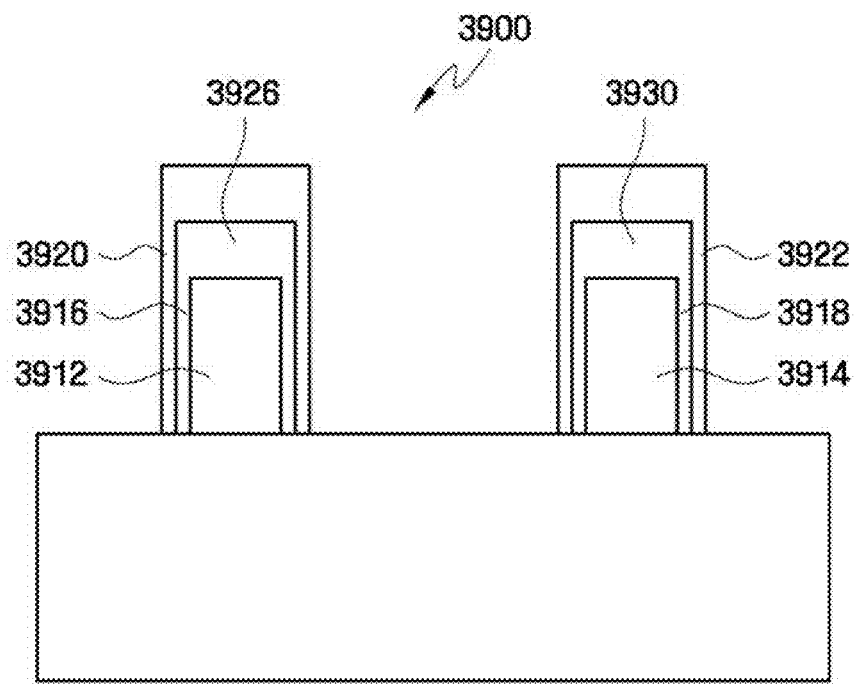
FIG. 39 shows a schematic diagram in vertical side view of an SRAM nFET with low-temperature oxidation (LTO) deposition for N+ polysilicon pre-doping in accordance with an exemplary embodiment of the present disclosure.

Turning now to FIG. 39, an nFET semiconductor structure of an SRAM with low-temperature oxidation (LTO) deposition for N+ polysilicon pre-doping is indicated generally by the reference numeral 3900. The structure 3900 includes first and second nFETs, shown here in vertical side view. The first nFET includes a pre-doped n-gate 3912, a silicon-nitride (SiN) side layer 3916, a SiN cap 3926, and an oxide layer 3920; and the second nFET includes a pre-doped n-gate 3914, a SiN side layer 3918, a SiN cap 3930, and an oxide layer 3922. Here, the first pre-doped n-gate 3912 is about 62.3 nm wide, the SiN layer 3916 is between about 10.5 and 11.5 nm wide, the oxide layer 3920 is between about 6.9 and 7.3 nm wide, and the SiN cap 3926 is about 33.3 nm deep. The second pre-doped n-gate 3914 is about 62.6 nm wide, the SiN layer 3918 is between about 10.3 and 10.6 nm wide, the oxide layer 3922 is about 5.6 nm wide, and the SiN cap 3930 is about 49.0 nm deep.

Figure 40:
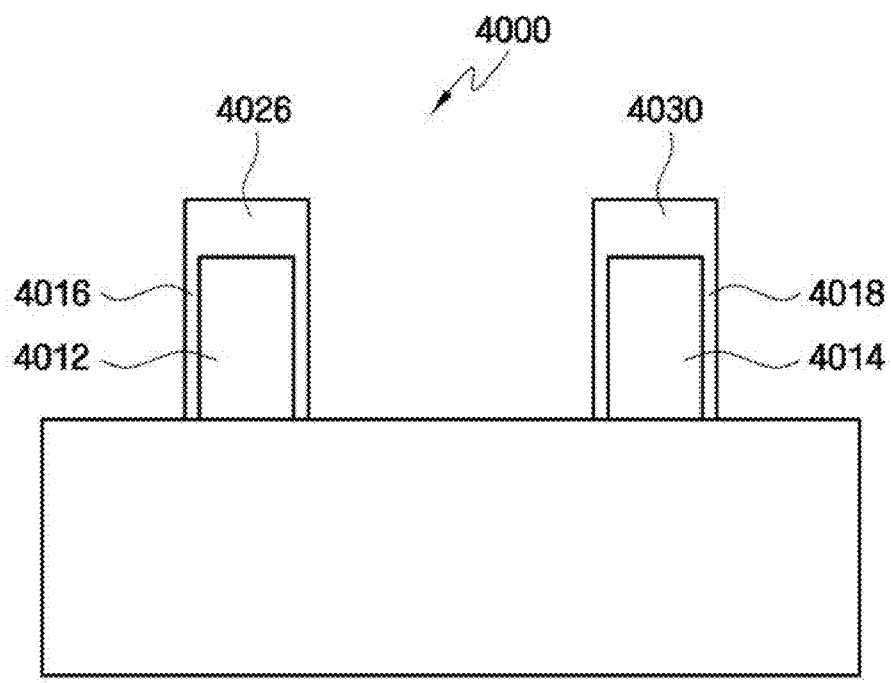
FIG. 40 shows a schematic diagram in vertical side view of an SRAM nFET with LTO strip for N+ polysilicon pre-doping in accordance with an exemplary embodiment of the present disclosure.

As shown in FIG. 40, an nFET semiconductor structure of an SRAM with LTO stripped for N+ polysilicon pre-doping is indicated generally by the reference numeral 4000. The structure 4000 is similar to the structure 3900 of FIG. 39, so duplicate description may be omitted. Here, an LTO strip has been performed, substantially eliminating the oxide layer from the nFETs. The first pre-doped n-gate 4012 is about 61.9 nm wide, the SiN layer 4016 is between about 9.5 and 10.5 nm wide, and the SiN cap 4026 is about 28.2 nm deep. The second pre-doped n-gate 4014 is about 61.6 nm wide, the SiN layer 4018 is between about 8.9 and 9.2 nm wide, and the SiN cap 4030 is about 29.2 nm deep.

Figure 41:
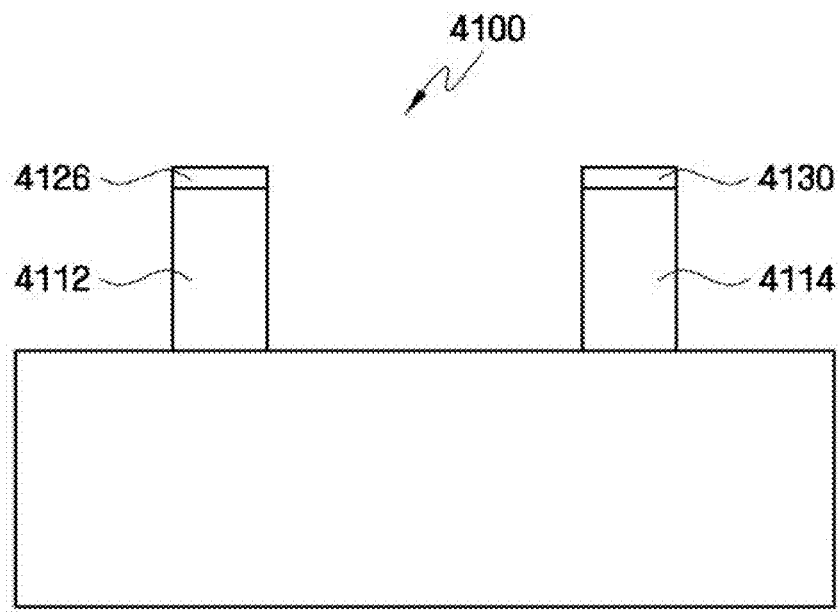
FIG. 41 shows a schematic diagram in vertical side view of an SRAM nFET with nitride stripped to about 100 A for N+ polysilicon pre-doping in accordance with an exemplary embodiment of the present disclosure.

Turning to FIG. 41, an nFET semiconductor structure of an SRAM with nitride stripped to about 100 A is indicated generally by the reference numeral 4100. The structure 4100 is similar to the structures 3900 and 4000 of FIGS. 39 and 40, so duplicate description may be omitted. Here, a nitride strip has been performed, substantially eliminating the SiN layer from the sides of the nFETs, and substantially reducing the SiN caps to roughly 100 A (10 nm). That is, SiN remains on top of the n-gate while substantially all sidewall SiN has been removed. The first pre-doped n-gate 4112 is about 64.1 nm wide, and the remaining SiN cap 4126 is about 9.2 nm deep. The second pre-doped n-gate 4114 is about 63.1 nm wide, and the remaining SiN cap 4130 is about 11.2 nm deep.

Figure 42:
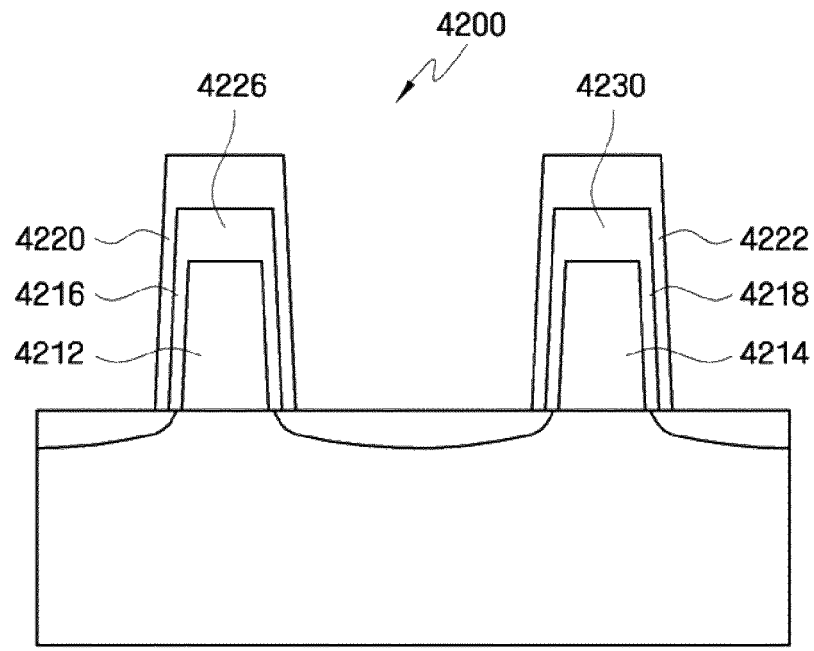
FIG. 42 shows a schematic diagram in vertical side view of an SRAM pFET with low-temperature oxidation (LTO) deposition for N+ polysilicon pre-doping in accordance with an exemplary embodiment of the present disclosure.

Turning now to FIG. 42, a pFET semiconductor structure of an SRAM with low-temperature oxidation (LTO) deposition for N+ polysilicon pre-doping is indicated generally by the reference numeral 4200. The structure 4200 includes first and second pFETs, shown here in vertical side view. The first pFET includes a p-gate 4212, a SiN side layer 4216, an oxide layer 4220, and a SiN cap 4226; and the second pFET includes a p-gate 4214, a SiN side layer 4218, an oxide layer 4222, and a SiN cap 4230. Here, the first p-gate 4212 is about 60.0 nm wide, the SiN side layer 4216 is about 10.6 nm wide, the oxide layer 4220 is about 5.5 nm wide, and the SiN cap 4226 is about 25.8 nm deep. The second p-gate 4214 is about 64.0 nm wide, the SiN side layer 4218 is about 10.9 nm wide, the oxide layer 4222 is about 7.0 nm wide, and the SiN cap 4230 is about 30.1 nm deep.

Figure 43:
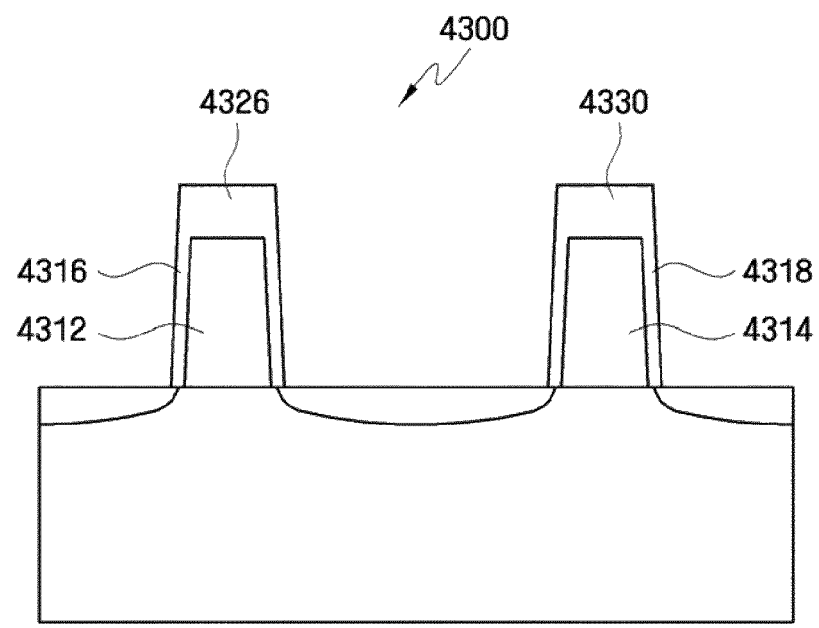
FIG. 43 shows a schematic diagram in vertical side view of an SRAM pFET with LTO strip for N+ polysilicon pre-doping in accordance with an exemplary embodiment of the present disclosure.

As shown in FIG. 43, a pFET semiconductor structure of an SRAM with LTO stripped for N+ polysilicon pre-doping is indicated generally by the reference numeral 4300. The structure 4300 is similar to the structure 4200 of FIG. 42, so duplicate description may be omitted. Here, an LTO strip has been performed, substantially eliminating the oxide layer from the pFETs. The first p-gate 4312 is about 57.3 nm wide, the SiN side layer 4316 is between about 8.6 and 11.8 nm wide, and the SiN cap 4026 is about 13.1 nm deep. The second p-gate 4314 is about 60.9 nm wide, the SiN layer 4318 is between about 8.6 and 11.3 nm wide, and the SiN cap 4330 is about 16.5 nm deep. In this exemplary embodiment, it shall be understood that the remaining SiN caps on the pFETs are substantially shorter than the remaining SiN caps on the nFETs of the same CMOS die at this processing stage.

Figures 44, 45:
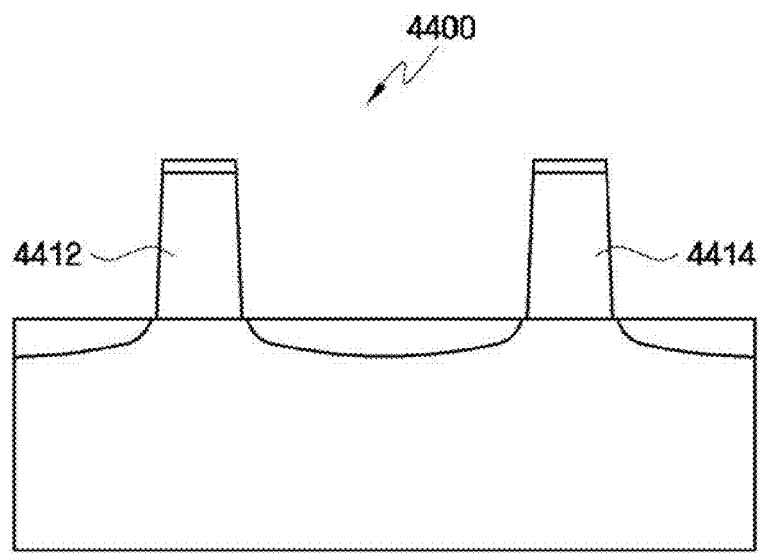
FIG. 44 shows a schematic diagram in vertical side view of an SRAM pFET with nitride strip for N+ polysilicon pre-doping in accordance with an exemplary embodiment of the present disclosure.
FIG. 45 shows a table of experimental results for five tested semiconductor wafers in accordance with an exemplary embodiment of the present disclosure.

Turning to FIG. 44, a pFET semiconductor structure of an SRAM with nitride stripped is indicated generally by the reference numeral 4400. The structure 4400 is similar to the structures 4300 and 4200 of FIGS. 43 and 42, respectively, so duplicate description may be omitted. Here, a nitride strip has been performed to reduce the SiN caps of the CMOS nFETs to about 100 A (10 nm), substantially eliminating both the SiN side layers and the SiN caps of the pFETs. The first p-gate 4412 is about 61.4 nm wide. The second p-gate 4414 is about 62.1 nm wide. Thus, the resulting widths of the p-gate structures 4412 and 4414 are substantially the same as the resulting widths of the n-gate structures 4012 and 4014 of FIG. 40. Thus, the method of pre-doping and nitride capping results in substantially equal sized n-gate and p-gate transistor structures.

Turning now to FIG. 45, a table of results is indicated generally by the reference numeral 4500. The table 4500 includes experimental results for five tested dice, chips or wafers. Here, the first and second columns identify each wafer. The third column indicates the extent of hot phosphate stripping following the etch of epitaxially grown silicon-germanium (eSiGe). The fourth column indicates that samples were cut for Cross-section Scanning Electron Microscopy (XSEM) analysis after etching of the second spacer (spacer-2 etch). The fifth column indicates that samples were cut for XSEM analysis after S/D ion implantation. The fifth column indicates remarks.

Here, a first wafer (ID #2) received a full hot phosphate strip after the eSiGe etch, where XSEM analysis was done after spacer-2 etch. A second wafer (ID #8) received a full hot phosphate strip after the eSiGe etch, where XSEM analysis was done after S/D ion-implantation. A third wafer (ID #18) received a hot phosphate strip to about 100 A (10 nm) nitride depth on the n-gate after the eSiGe etch, where XSEM analysis was done after spacer-2 etch. For the third wafer, the nitride was completely removed from the pFET, but remained on the nFET with a depth of about 10 nm. A fourth wafer (ID #21) received a hot phosphate strip to about 100 A nitride depth on the n-gate after the eSiGe etch, where XSEM analysis was done after S/D ion-implantation. A fifth wafer (ID #23) received a hot phosphate strip to about 100 A nitride depth on the n-gate after the eSiGe etch.

Figure 46:
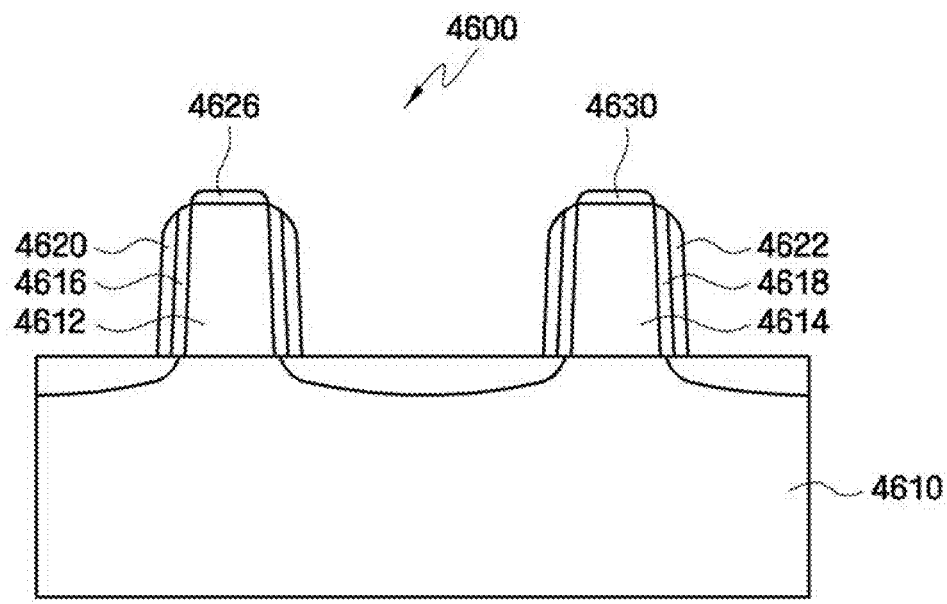
FIG. 46 shows a schematic diagram in vertical side view of a nitride capping SRAM pFET after second spacer etch and cleaning in accordance with an exemplary embodiment of the present disclosure.

As shown in FIG. 46, a nitride capping type pFET semiconductor structure after second spacer etch and cleaning, but before S/D ion implantation, is indicated generally by the reference numeral 4600. The structure 4600 includes a substrate 4610 and two pFETs. The first pFET includes a p-gate 4612, a low temperature oxide (LTO) layer 4626 on top of the p-gate, a SiN side layer 4616, and an oxide side layer 4620. The p-gate 4612 is about 53.2 nm wide near its base and about 47.6 nm wide near its top. The LTO 4626 is about 6.9 nm deep. The second pFET includes a p-gate 4614, a low temperature oxide (LTO) layer 4630 on top of the p-gate, a SiN side layer 4618, and an oxide side layer 4622. The p-gate 4614 is about 49.6 nm wide near its base and about 45.3 nm wide near its top. The LTO 4630 is about 6.6 nm deep. Thus, the thickness of LTO remaining on the pFETs is about 70 angstroms (Å). Here, the SiN and oxide side layers extend to the top of each p-gate sidewall. The tops of the nitride capping type p-gates are substantially rectangular.

Figure 47:
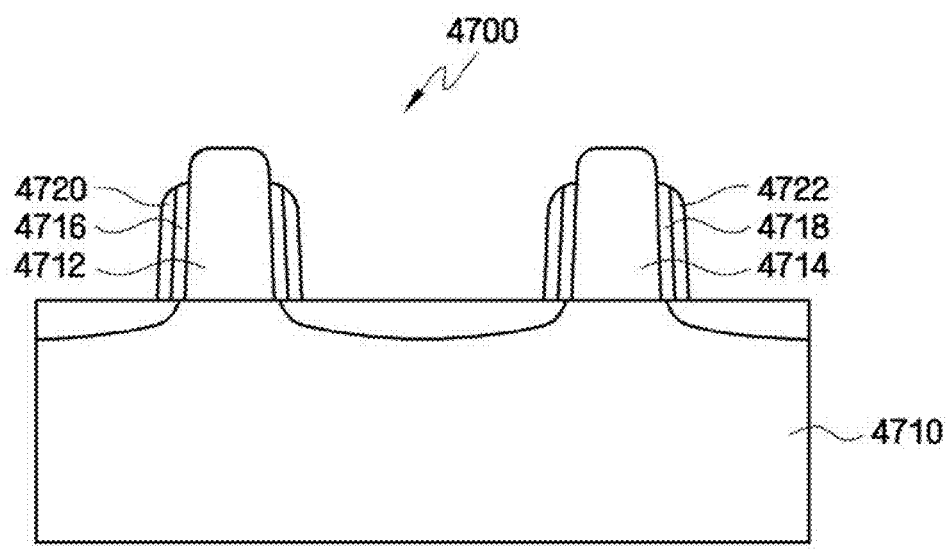
FIG. 47 shows a schematic diagram in vertical side view of a non-capping SRAM pFET after second spacer etch and cleaning in accordance with an exemplary embodiment of the present disclosure.

Turning to FIG. 47, a non-capping type pFET semiconductor structure after second spacer etch and cleaning, but before BP IPS, is indicated generally by the reference numeral 4700. The structure 4700 includes a substrate 4710 and two pFETs. The first pFET includes a p-gate 4712, a SiN side layer 4716, and an oxide side layer 4720. The p-gate 4612 is about 48.6 nm wide near its base and about 45.0 nm wide near its top. There is no LTO top layer. The second pFET includes a p-gate 4714, a SiN side layer 4718, and an oxide side layer 4722. The p-gate 4714 is about 49.6 nm wide near its base and about 46.0 nm wide near its top. There is no LTO top layer. Thus, the thickness of LTO remaining on the non-capping type pFETs is zero. Here, the SiN and oxide side layers do not extend to the top of each p-gate sidewall. That is, the SiN and oxide side layers 4716 and 4720 fall about 41.0 nm short of the top of p-gate 4712, and the SiN and oxide side layers 4718 and 4722 fall about 36.4 nm short of the top of p-gate 4714. The tops of the non-capping type p-gates are substantially rounded.

Figure 48:
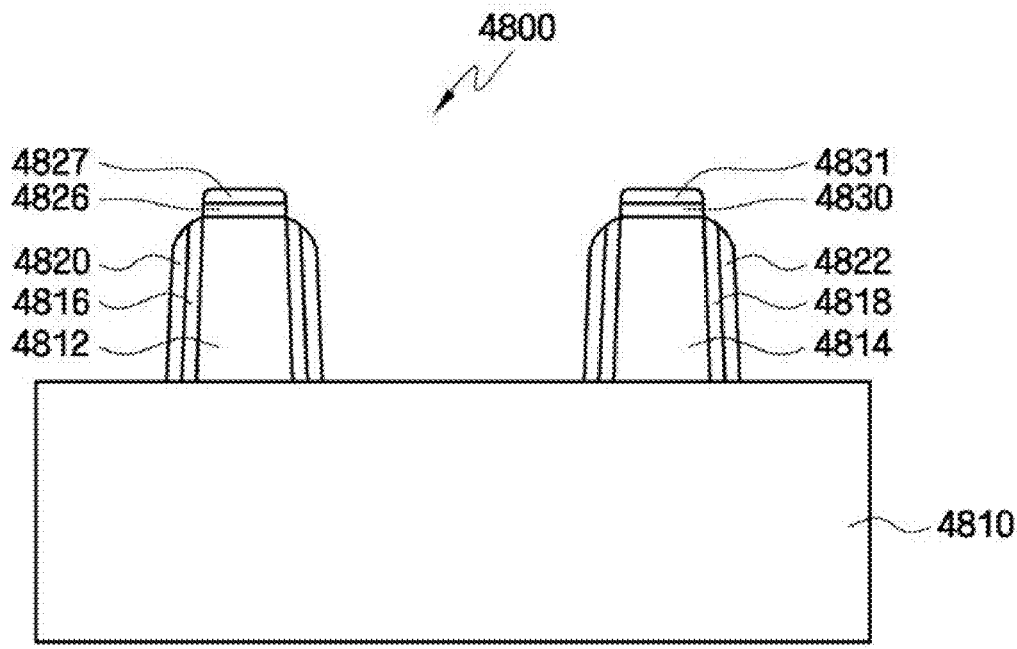
FIG. 48 shows a schematic diagram in vertical side view of a nitride capping SRAM nFET after second spacer etch and cleaning in accordance with an exemplary embodiment of the present disclosure.

Turning now to FIG. 48, a nitride capping type nFET semiconductor structure after second spacer etch and cleaning, but before BP IPS, is indicated generally by the reference numeral 4800. The structure 4800 includes a substrate 4810 and two nFETs. The first nFET includes an n-gate 4812, an LTO layer 4826 on top of the n-gate, a nitride cap 4827 on top of the LTO, a SiN side layer 4816, and an oxide side layer 4820. The n-gate 4812 is about 53.8 nm wide near its base and about 38.5 nm wide near its top. The remaining LTO 4826 is about 13 nm (130 A) tall and the remaining nitride cap 4827 is about 7.6 nm tall. The second nFET includes an n-gate 4814, an LTO layer 4830 on top of the n-gate, a nitride cap 4831 on top of the LTO, a SiN side layer 4818, and an oxide side layer 4822. The n-gate 4814 is about 51.8 nm wide near its base and about 36.2 nm wide near its top. The remaining LTO 4830 is about 13 nm (130 A) tall and the remaining nitride cap is about 9.3 nm tall. Thus, the thickness of LTO remaining on the nFETs is about 13 nm (130 A), and the thickness of nitride caps remaining on the nFETs is about 8 nm (80 A). Here, the SiN and oxide side layers extend to the top of each n-gate sidewall. The tops of the nitride capping type n-gates are substantially rectangular.

Figure 49:
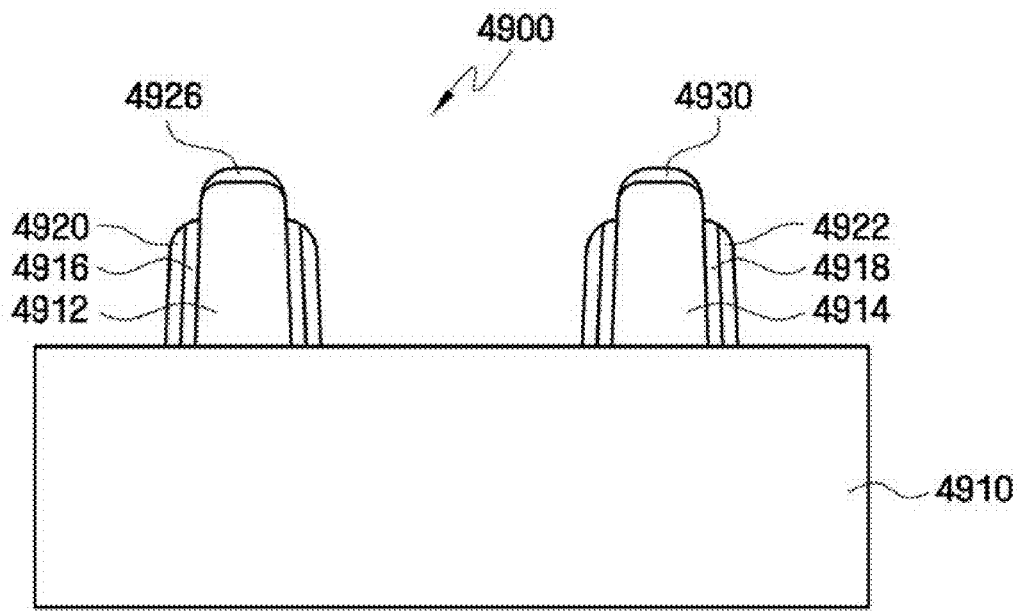
FIG. 49 shows a schematic diagram in vertical side view of a non-capping SRAM nFET after second spacer etch and cleaning in accordance with an exemplary embodiment of the present disclosure.

Turning to FIG. 49, a non-capping type nFET semiconductor structure after second spacer etch and cleaning, but before BP IPS, is indicated generally by the reference numeral 4900. The structure 4900 includes a substrate 4910 and two nFETs. The first nFET includes an n-gate 4912, an LTO layer 4926 on top of the n-gate, and an oxide side layer 4920. The n-gate 4912 is about 48.6 nm wide near its base and about 36.0 nm wide near its top. The remaining LTO 4926 is about 4.3 nm tall and the remaining oxide side layer 4920 falls about 37.7 nm short of the top of the n-gate. The second nFET includes an n-gate 4914, an LTO layer 4930 on top of the n-gate, and an oxide side layer 4922. The n-gate 4814 is about 48.0 nm wide near its base and about 30.1 nm wide near its top. The remaining LTO 4930 is about 4.3 nm tall and the remaining oxide side layer 4922 falls about 33.1 nm short of the top of the n-gate. That is, the remaining side oxide no longer reaches the top of the n-gate. The tops of the non-capping type n-gates are substantially rounded, and there is a high risk of stringers.

Figure 50:
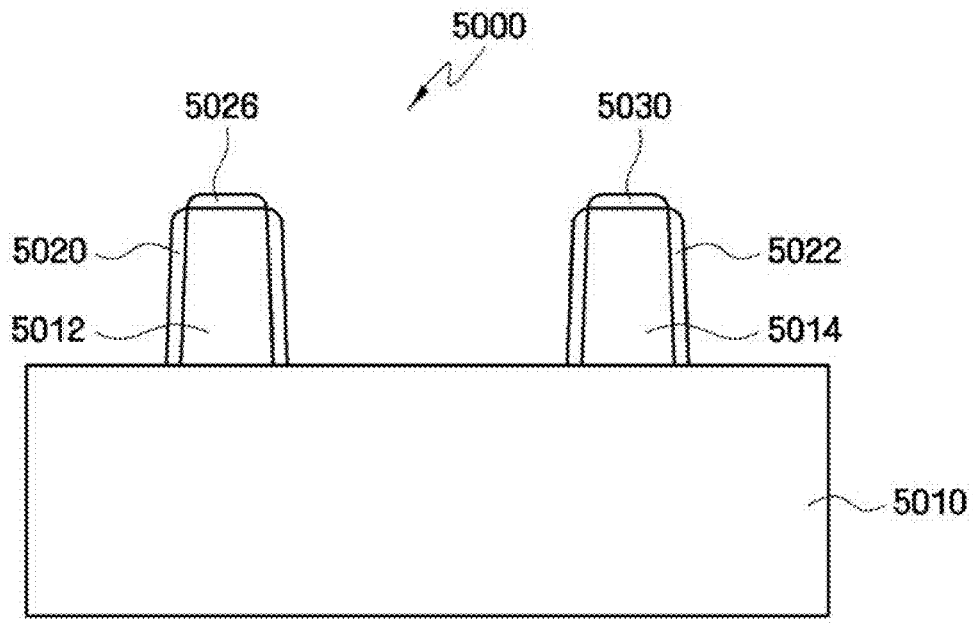
FIG. 50 shows a schematic diagram in vertical side view of a nitride capping SRAM pFET after S/D ion-implantation and SM LTO deposition in accordance with an exemplary embodiment of the present disclosure.

Turning now to FIG. 50, a nitride capping type pFET semiconductor SRAM structure after S/D ion-implantation and SM LTO deposition is indicated generally by the reference numeral 5000. The structure 5000 includes a substrate 5010 and two similar pFETs. The first pFET includes a p-gate 5012, an LTO layer 5026 on top of the p-gate, and an oxide side spacer 5020. The p-gate 5012 is about 100.9 nm tall. The second pFET includes a p-gate 5014, an LTO layer 5030 on top of the p-gate, and an oxide side spacer 5022. The p-gate 5014 is about 54.3 nm wide near its base and about 51.3 nm wide near its top. Either nitride and/or oxide may be used for capping in standard power-level devices.

Figure 51:
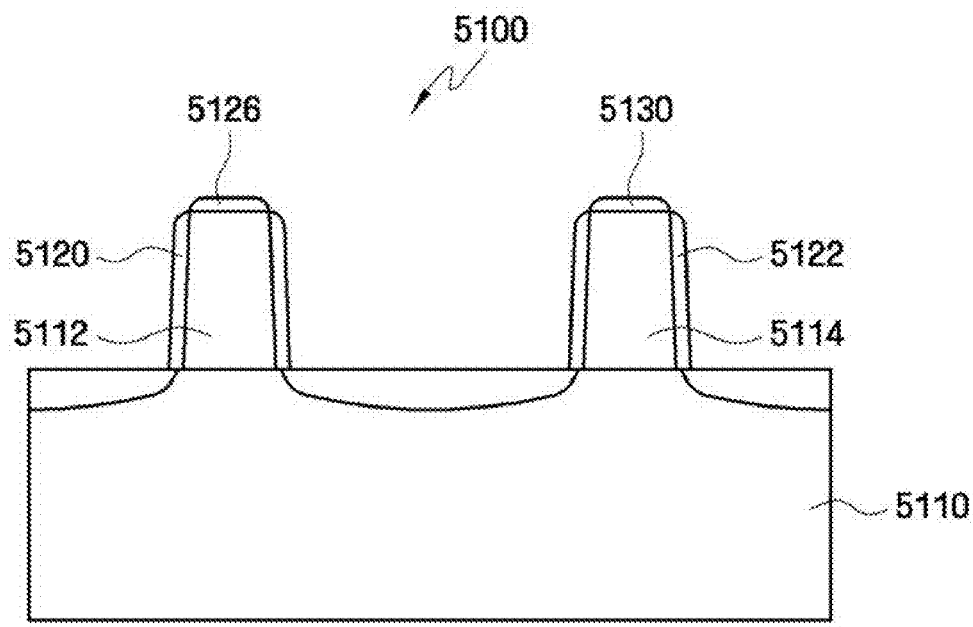
FIG. 51 shows a schematic diagram in vertical side view of a non-capping SRAM pFET after S/D ion-implantation and SM LTO deposition in accordance with an exemplary embodiment of the present disclosure.

As shown in FIG. 51, a non-capping type pFET semiconductor SRAM structure after S/D ion-implantation and SM LTO deposition is indicated generally by the reference numeral 5100. The structure 5100 includes a substrate 5110 and two similar pFETs. The first pFET includes a p-gate 5112, an LTO layer 5126 on top of the p-gate, and an oxide side spacer 5120. The p-gate 5112 is about 53.7 nm wide near its base and about 48.7 nm wide near its top. The second pFET includes a p-gate 5114, an LTO layer 5130 on top of the p-gate, and an oxide side spacer 5122. The p-gate 5114 is about 97.0 nm tall.

Figure 52:
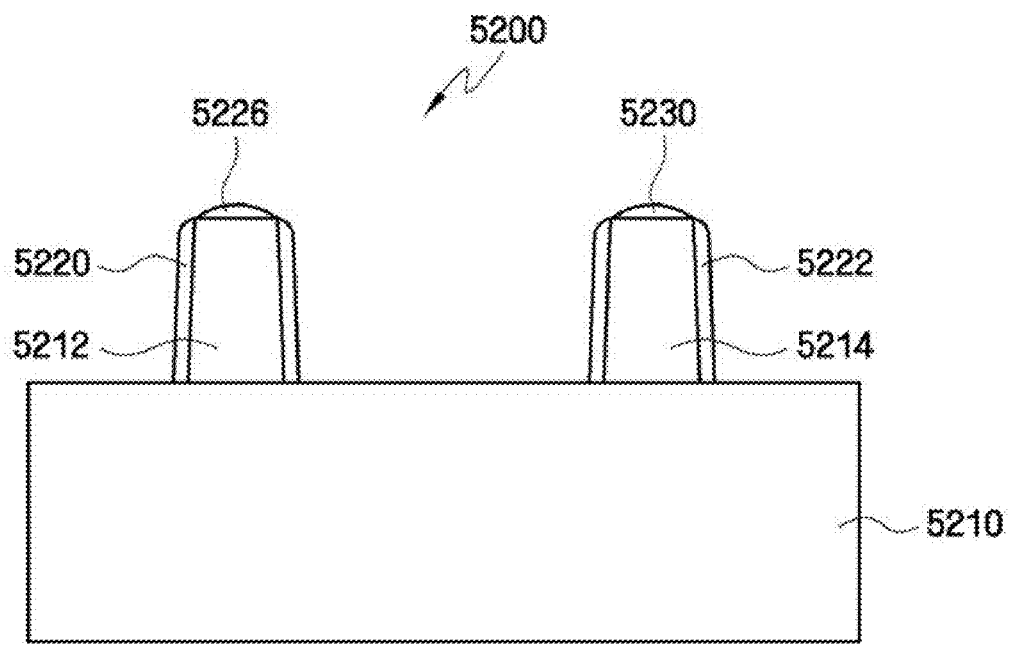
FIG. 52 shows a schematic diagram in vertical side view of a nitride capping SRAM nFET after S/D ion-implantation and SM LTO deposition in accordance with an exemplary embodiment of the present disclosure.

Turning to FIG. 52, a nitride capping type nFET semiconductor SRAM structure after S/D ion-implantation and SM LTO deposition is indicated generally by the reference numeral 5200. The structure 5200 includes a substrate 5210 and two nFETs. The first nFET includes an n-gate 5212, an LTO layer 5226 on top of the n-gate, and an oxide side spacer 5220. The n-gate 5212 is about 55.2 nm wide near its base and about 40.6 nm wide near its top. The second nFET includes an n-gate 5214, an LTO layer 5230 on top of the n-gate, and an oxide side spacer 5222. The n-gate 5214 is about 92.8 nm tall. The tops of the capping type n-gates are substantially rectangular. Either nitride and/or oxide may be used for capping in standard power-level devices.

Figure 53:
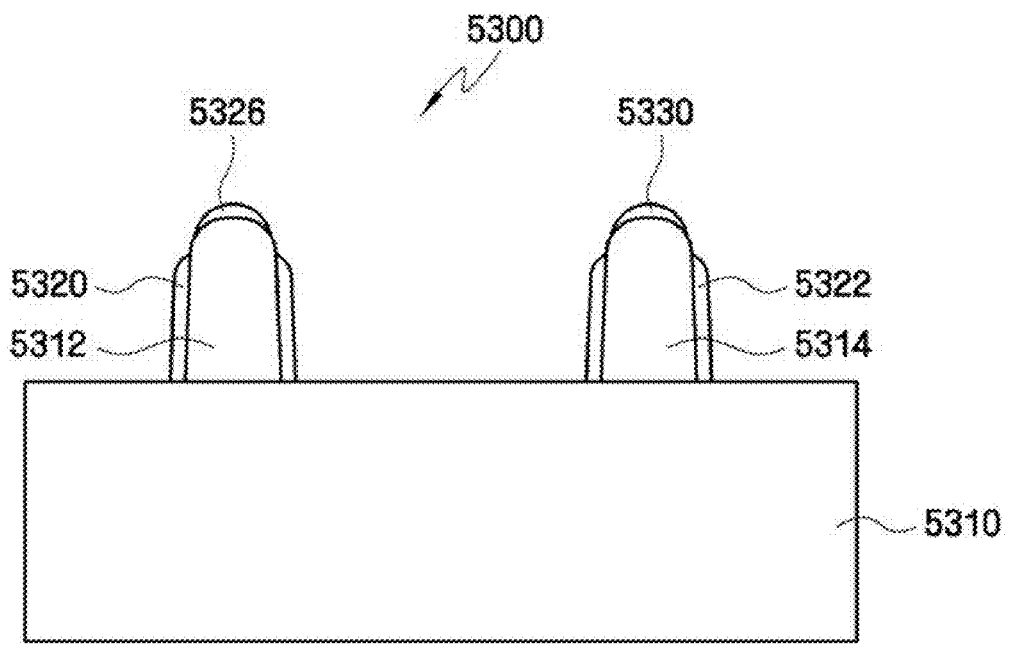
FIG. 53 shows a schematic diagram in vertical side view of a non-capping SRAM nFET after S/D ion-implantation and SM LTO deposition in accordance with an exemplary embodiment of the present disclosure.

Turning now to FIG. 53, a non-capping type nFET semiconductor SRAM structure after S/D ion-implantation and SM LTO deposition is indicated generally by the reference numeral 5300. The structure 5300 includes a substrate 5310 and two nFETs. The first nFET includes an n-gate 5312, an LTO layer 5326 on top of the n-gate, and an oxide side spacer 5320. The n-gate 5312 is about 56.4 nm wide near its base and about 52.7 nm wide near its top. The second nFET includes an n-gate 5314, an LTO layer 5330 on top of the n-gate, and an oxide side spacer 5322. The n-gate 5314 is about 92.4 nm tall. The tops of the non-capping type n-gates are substantially rounded, and there is a high risk of stringers.

Figure 54:
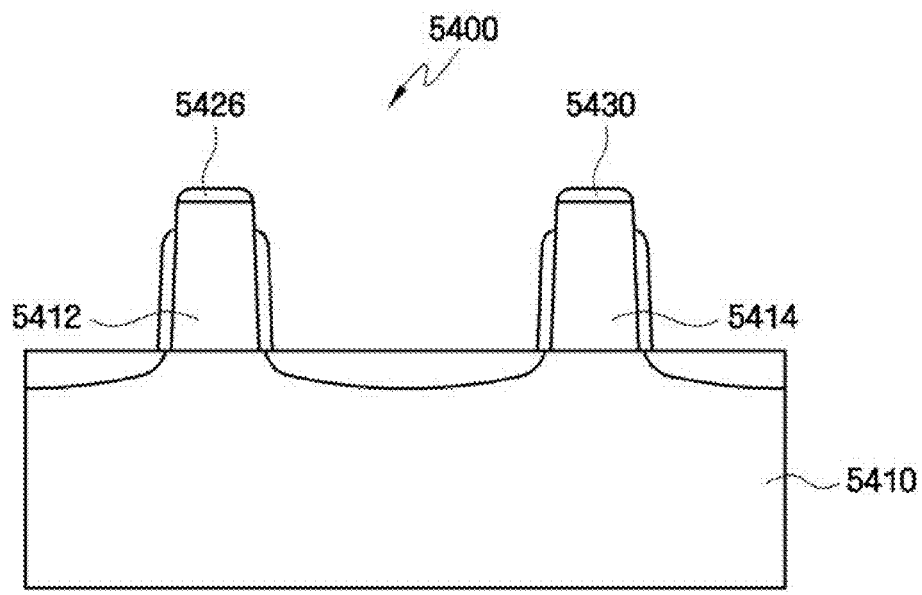
FIG. 54 shows a schematic diagram in vertical side view of a nitride capping gate 800 A SRAM pFET after WN nitride deposition in accordance with an exemplary embodiment of the present disclosure.

As shown in FIG. 54, a nitride capping type pFET semiconductor gate 800 A SRAM structure after the contact etch stopper nitride (WN) deposition is indicated generally by the reference numeral 5400. The structure 5400 includes a substrate 5410 and two similar pFETs. The first pFET includes a p-gate 5412 with nitride cap 5426. The second pFET includes a p-gate 5414 with nitride cap 5430. Either nitride and/or oxide may be used for capping in alternate embodiments.

Figure 55:
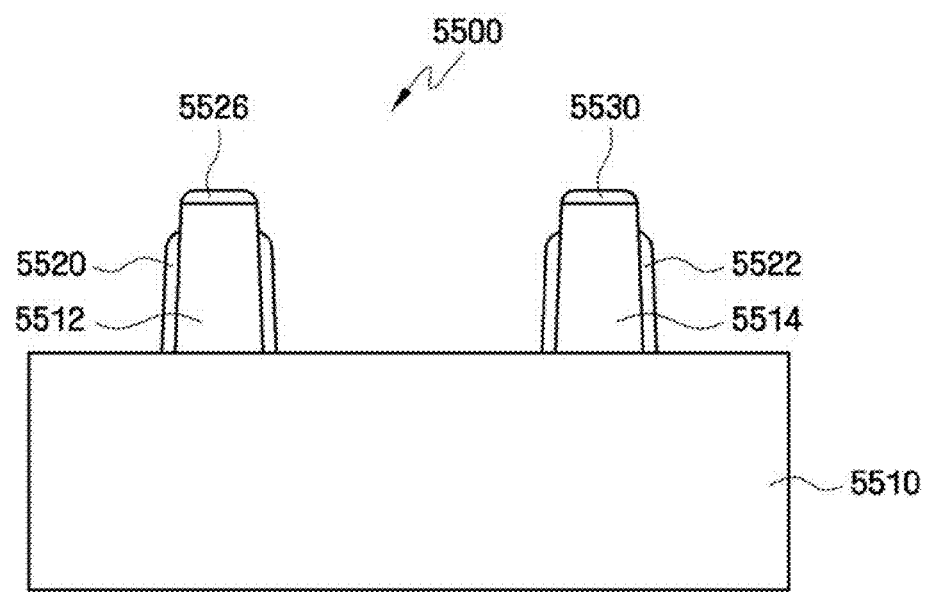
FIG. 55 shows a schematic diagram in vertical side view of a nitride capping gate 800 A SRAM nFET after WN nitride deposition in accordance with an exemplary embodiment of the present disclosure.

Turning to FIG. 55, a nitride capping type nFET semiconductor gate 800 A SRAM structure after WN nitride deposition is indicated generally by the reference numeral 5500. The structure 5500 includes a substrate 5510 and two nFETs. The first nFET includes an n-gate 5512, an oxide side spacer 5520, and a nitride cap 5526. The second nFET includes an n-gate 5514, an oxide side spacer 5522, and a nitride cap 5530. The tops of the capping type n-gates are substantially rectangular. That is, none of the capping type p-gates 5412 or 5414 of FIG. 54 nor the capping type n-gates 5512 or 5514 of FIG. 55 exhibit any rounded profiles. Either nitride and/or oxide may be used for capping in alternate embodiments.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. A method of transistor formation using a capping layer in complimentary metal-oxide semiconductor (CMOS) structures, the method comprising:
   depositing a conductive layer over an n-type field effect transistor (nFET) and over a p-type field effect transistor (pFET);
   depositing a capping layer directly over the conductive layer;
   etching the capping and conductive layers to form at least one capped gate conductor to gates of the nFET and pFET, respectively;
   ion-implanting the nFET transistor with a first dopant;
   ion-implanting the pFET transistor with a second dopant; and
   remaining at least or capped gate conductor in the finished CMOS structure,
   wherein ion-implanting at least one of the transistors substantially dopes its source and drain regions, but not its gate region.

2. A method as defined in claim 1 wherein the conductive layer comprises polycrystalline silicon.

3. A method as defined in claim 1 wherein the conductive layer comprises metal.

4. A method as defined in claim 1 wherein the capping layer comprises nitride.

5. A method as defined in claim 1 wherein the capping layer comprises oxide.

6. A method as defined in claim 1 wherein the first dopant comprises at least one of arsenic or phosphene.

7. A method as defined in claim 1 wherein the second dopant comprises boron di-fluoride.

8. A method as defined in claim 1 wherein ion-implanting the nFET and pFET substantially dopes the sources and drains of the transistors, but not the capped gates.

9. A method as defined in claim 1 wherein the gate conductor widths of the nFET and pFET are substantially the same.

10. A method of transistor formation using a capping layer in complimentary metal-oxide semiconductor (CMOS) structures, the method comprising:
    depositing a conductive layer over an n-type field effect transistor (nFET) and over a p-type field effect transistor (pFET);
    depositing a capping layer directly over the conductive layer;
    etching the capping and conductive layers to form at least one capped gate conductor to gates of the nFET and pFET, respectively;
    ion-implanting the nFET transistor with a first dopant;
    ion-implanting the pFET transistor with a second dopant, wherein ion-implanting at least one of the transistors substantially dopes its source and drain regions, but not its gate region; and
    substantially uncapping the pFET gate conductor, wherein ion-implanting the nFET substantially dopes the source and drain regions of the nFET, but not the capped gate region of the nFET, and ion-implanting the pFET substantially dopes the source and drain regions of the pFET as well as the substantially uncapped gate region of the pFET.

11. A method of transistor formation using a capping layer in complimentary metal-oxide (CMOS) structures, the method comprising:
    depositing a conductive layer over an n-type field effect transistor (nFET) and over a p-type field effect transistor (pFET);
    depositing a capping layer directly over the conductive layer;
    etching the capping and conductive layers to form at least one capped gate conductor to gates of the nFET and pFET, respectively;
    ion-implanting the nFET transistor with first dopant;
    ion-implanting the pFET transistor with a second dopant, wherein ion-implanting at least one of the transistors substantially dopes its source and drain regions, but not its gate region; and
    pre-doping at least one of the gate conductor or the gate region of at least one of the nFET or pFET.

12. A method as defined in claim 1, further comprising removing the capping layer.

13. A method as defined in claim 1, further comprising forming silicide on the nFET and pFET gate conductors.

14. A method as defined in claim 1, further comprising forming at least one spacer on the gate conductors.

15. A method of transistor formation using a capping layer in complimentary metal-oxide semiconductor (CMOS) structures, the method comprising:
    depositing a conductive layer over an n-type field effect transistor (nFET) and over a p-type field effect transistor (pFET);
    depositing a capping layer directly over the conductive layer;

etching the capping and conductive layers to form at least one capped gate conductor to gates of the nFET and pFET, respectively;
ion-implanting the nFET transistor with, a first dopant;
ion-implanting the pFET transistor with a second dopant; and
forming at least one spacer on the gate conductors,
wherein ion-implanting at least of the transistors substantially dopes its source and drain regions, but not its gate region and wherein the at least one spacer comprises epitaxially grown silicon-germanium (eSiGe).

16. A method as defined in claim 14 wherein the at least one spacer comprises oxide.

17. A method as defined in claim 16 wherein the at least one oxide spacer comprises at least one of a re-oxidation layer, a low temperature oxidation (LTO) layer, or a plasma enhanced (PE) oxide layer.

18. A method as defined in claim 14 wherein the at least one spacer comprises a molecular layer deposition (MLD) nitride layer.

19. A method as defined in claim 14, further comprising remaining the at least one spacer on the gate conductors in the finished CMOS structure.

* * * * *